(12) United States Patent
Chen et al.

(10) Patent No.: US 11,239,121 B2
(45) Date of Patent: Feb. 1, 2022

(54) METAL GATE CONTACTS AND METHODS OF FORMING THE SAME

(71) Applicant: Taiwan Semiconductor Manufacturing Co., Ltd., Hsin-Chu (TW)

(72) Inventors: Chih-Hsuan Chen, Hsinchu (TW); Jui-Lin Chen, Taipei (TW); Yu-Kuan Lin, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/012,530

(22) Filed: Sep. 4, 2020

(65) Prior Publication Data
US 2021/0098471 A1 Apr. 1, 2021

Related U.S. Application Data

(60) Provisional application No. 62/906,277, filed on Sep. 26, 2019.

(51) Int. Cl.
| H01L 21/8238 | (2006.01) |
| H01L 27/11 | (2006.01) |
| H01L 23/522 | (2006.01) |
| H01L 21/768 | (2006.01) |

(52) U.S. Cl.
CPC ........ *H01L 21/823821* (2013.01); *H01L 21/76805* (2013.01); *H01L 21/76877* (2013.01); *H01L 23/5226* (2013.01); *H01L 27/1104* (2013.01)

(58) Field of Classification Search
CPC . H01L 21/76; H01L 21/768; H01L 21/76802; H01L 21/76805; H01L 21/76816; H01L 21/76838; H01L 21/76877; H01L 21/823431; H01L 21/823475; H01L 21/823821; H01L 21/823871; H01L 27/1104; H01L 29/401; H01L 29/41; H01L 29/4232; H01L 29/42372; H01L 29/72384; H01L 29/772; H01L 29/78; H01L 29/7831;
(Continued)

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Cheung Lee
(74) *Attorney, Agent, or Firm* — Haynes and Boone, LLP

(57) ABSTRACT

A method of forming a semiconductor device includes providing a structure that includes a substrate, a first fin and a second fin, a first gate structure engaging the first fin, and a second gate structure engaging the second fin; depositing a dielectric layer over the first and second gate structures; etching the dielectric layer, thereby forming a first gate contact opening exposing the first gate structure and a second gate contact opening exposing the second gate structure, wherein the first gate contact opening has a first length that is larger than a second length of the second gate contact opening; and filling the first and second gate contact openings with conductive material, thereby forming a first gate contact engaging the first gate structure and a second gate contact engaging the second gate structure.

20 Claims, 18 Drawing Sheets

(58) Field of Classification Search
CPC .............. H01L 29/785; H01L 29/7851; H01L 29/7855; H01L 29/792
See application file for complete search history.

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2013/0224939 A1* | 8/2013 | Jagannathan ......... H01L 23/485 438/585 |

* cited by examiner

METAL GATE CONTACTS AND METHODS OF FORMING THE SAME

PRIORITY

This application claims priority to U.S. Provisional Patent Application Ser. No. 62/906,277, filed Sep. 26, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of a polysilicon gate with a metal gate to improve device performance with the decreased feature sizes. One process of forming a metal gate is termed a replacement gate or "gate-last" process in which the metal gate is fabricated "last" which allows for reduced number of subsequent processes. In a "gate-last" process, various metal layers, such as work function metal layers and metal fill layers, are sequentially deposited in a gate trench that is formed in a place reserved by a dummy gate. However, there are challenges to implementing such IC fabrication processes, especially with scaled down IC features in advanced process nodes. One challenge is the difficulty in depositing metal layers into a high-aspect-ratio gate trench due to decreasing gate width, such as in memory devices (e.g., static random-access memory (SRAM) devices). An object of the present disclosure seeks to resolve this issue, among others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
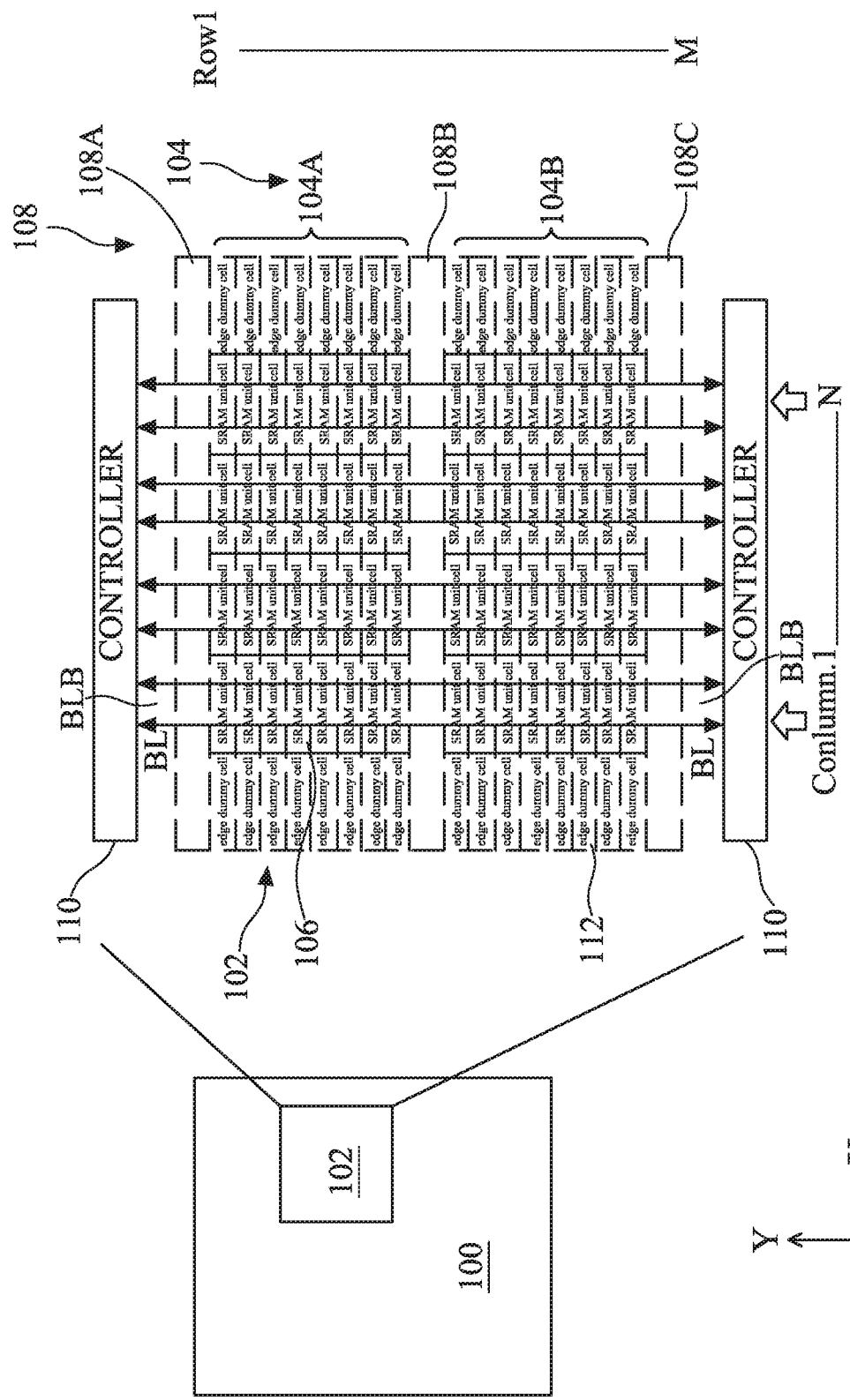
FIG. 1 is a simplified block diagram of an integrated circuit (IC) with an embedded memory macro, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to different gate contacts for NFET regions and PFET regions of a memory device, such as static random-access memory (SRAM) cells. A gate contact connects a metal gate electrode of a transistor to an overlying level, such as a via level. A gate contact is often formed by creating an opening above a gate electrode and filling the opening with conductive materials in processes such as damascene or dual-damascene. The openings for gate contacts are often shaped as round or square and are uniform across the circuit. In the present disclosure, gate contacts in an NFET region of an SRAM cell has an elongated shape in a top view compared to others in a square shape in a PFET region and also extend deeper into underlying gate electrodes in an NFET region than others in a PFET region. During gate contact formation, the formation of an elongated opening extending deeper into an n-type transistor's gate electrode introduces extra oxidation to an aluminum-containing conductive layer (e.g., metal fill layer)

of the gate electrode. The extra oxidation would increase threshold voltage (Vt) of the n-type transistor, which allows one or more metal layers (e.g., TiN layer) in the gate electrode to become thinner to offset Vt changes. A thinner metal layer in turn improves metal layer gap filling capability in a "gate-last" process as gate trenches become high aspect ratio with the advancement in process nodes.

FIG. 1 shows a semiconductor device 100 (or device 100) with a memory macro 102. The semiconductor device 100 can be, e.g., a microprocessor, an application specific integrated circuit (ASIC), a field programmable gate array (FPGA), or a digital signal processor (DSP). Further, semiconductor device 100 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The exact functionality of semiconductor device 100 is not a limitation to the provided subject matter. In the illustrated embodiment, memory macro 102 is a static random access memory (SRAM) macro, such as a single-port SRAM macro, a dual-port SRAM macro, or other types of SRAM macro. However, the present disclosure contemplates embodiments, where memory macro 102 is another type of memory, such as a dynamic random access memory (DRAM), a non-volatile random access memory (NVRAM), a flash memory, or other suitable memory. FIG. 1 has been simplified for the sake of clarity to better understand the inventive concepts of the present disclosure. Additional features can be added in memory macro 102, and some of the features described below can be replaced, modified, or eliminated in other embodiments of memory macro 102.

Memory macro 102 includes one or more circuit regions 104, such as circuit regions 104A and 104B in the illustrated embodiment. Circuit regions 104 contain all the memory cells 106 of memory macro 102. Circuit regions 104 are also referred to as memory cell regions 104. Memory cells 106 are generally implemented in forms of arrays in circuit regions 104. Each memory cell 106, such as an SRAM memory cell, is configured to store data. Memory cell 106 may be implemented with various PMOS and NMOS transistors such as planar transistors, fin field-effect transistor (FinFET), gate-all-around (GAA) nanosheet transistors, GAA nanowire transistors, or other types of transistors. In the illustrated embodiment, memory cells 106 include various p-type FinFETs and n-type FinFETs.

Memory macro 102 also includes one or more strap regions 108, such as strap regions 108A, 108B, and 108C oriented lengthwise along an x-direction in the illustrated embodiment. Strap regions 108A and 108C are located at the edge of memory macro 102 and strap region 108B is located between circuit regions 104A and 104B. Each of strap regions 108 does not contain memory cells and is used for implementing well pick-up structures. A well pick-up structure is generally configured to electrically couple a voltage to an n-well of memory cells 106 or a p-well of memory cells 106.

Further, memory macro 102 may include various contact features (or contacts), vias, and metal lines for connecting the source, drain, and gate electrodes (or terminals) of the transistors to form an integrated circuit.

Still referring to FIG. 1, memory cells 106 are arranged in column 1 to column N each extending along a first direction (here, in a y-direction) and row 1 to row M each extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 106 in true form and complementary form on a column-by-column basis. Row 1 to row M each includes a word line (WL) (not shown) that facilitates access to respective memory cells 106 on a row-by-row basis. Each memory cell 106 is electrically connected to a respective BL, a respective BLB, and a respective WL, which are electrically connected to a controller 110. Controller 110 is configured to generate one or more signals to select at least one WL and at least one bit line pair (here, BL and BLB) to access at least one of memory cells 106 for read operations and/or write operations. Controller 110 includes any circuitry suitable to facilitate read/write operations from/to memory cells 106, including but not limited to, a column decoder circuit, a row decoder circuit, a column selection circuit, a row selection circuit, a read/write circuit (for example, configured to read data from and/or write data to memory cells 106 corresponding to a selected bit line pair (in other words, a selected column)), other suitable circuit, or combinations thereof. In some implementations, controller 110 includes at least one sense amplifier (not shown) configured to detect and/or amplify a voltage differential of a selected bit line pair. In some implementations, the sense amplifier is configured to latch or otherwise store data values of the voltage differential.

A perimeter of memory macro 102 is configured with dummy cells, such as edge dummy cells 112, to ensure uniformity in performance of memory cells 106. Dummy cells are configured physically and/or structurally similar to memory cells 106, but do not store data. For example, dummy cells can include p-type wells, n-type wells, fin structures (including one or more fins), gate structures, source/drain features, and/or contact features. In the illustrated embodiment, row 1 to row M each begins with an edge dummy cell 112 and ends with an edge dummy cell 112, such that row 1 to row M of memory cells 106 are disposed between two edge dummy cells 112.

Figure 2:
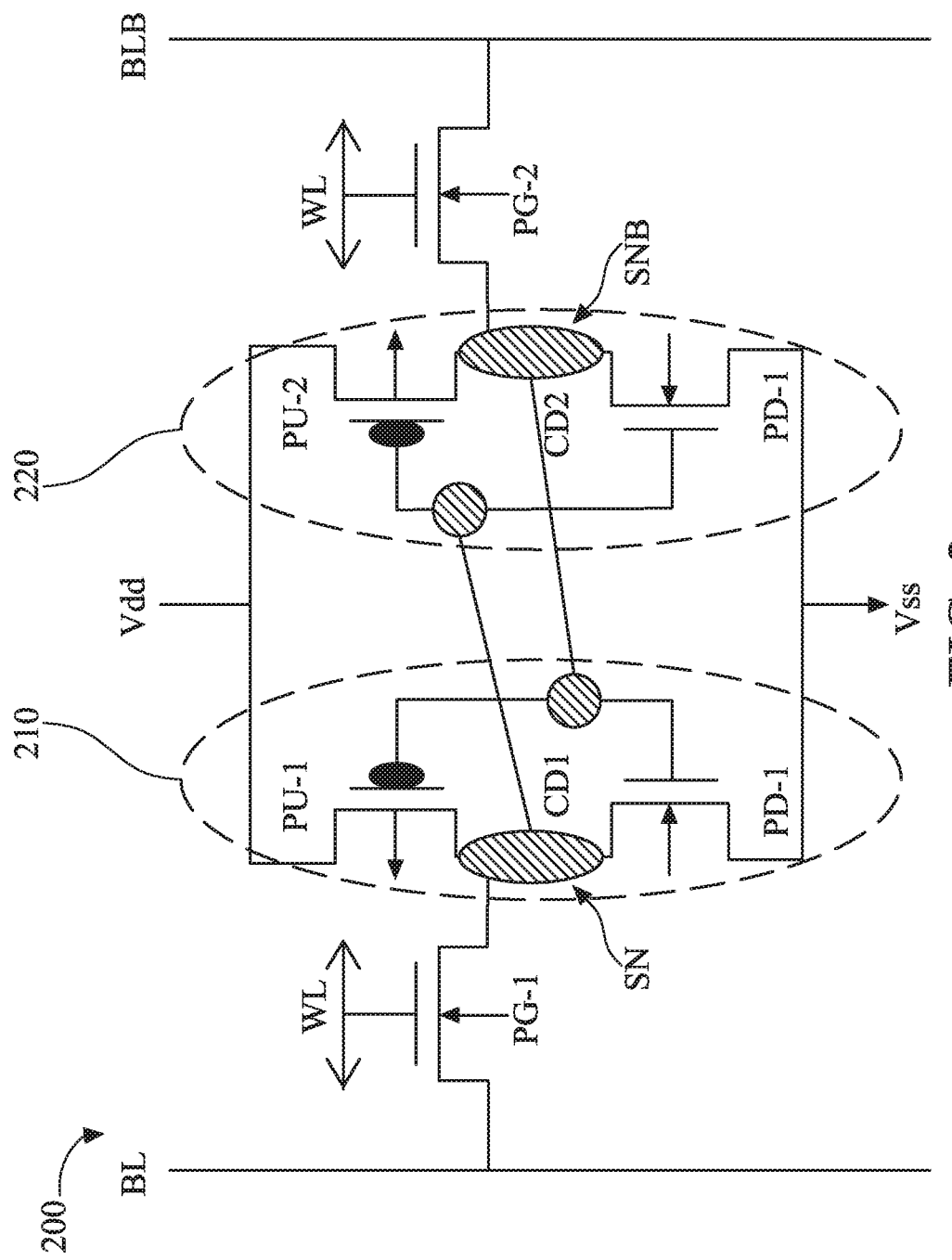
FIG. 2 is a circuit diagram of a SRAM bit cell, which can be implemented in a memory cell of a memory macro, according to various aspects of the present disclosure.

FIG. 2 is a circuit diagram of a SRAM bit cell 200, which can be implemented in a memory cell of a SRAM array, according to various aspects of the present disclosure. In some implementations, SRAM bit cell 200 is implemented in one or more memory cells 106 of memory macro 102 (FIG. 1). FIG. 2 has been simplified for the sake of clarity to better understand the inventive concepts of the present disclosure. Additional features can be added in SRAM bit cell 200, and some of the features described below can be replaced, modified, or eliminated in other embodiments of SRAM bit cell 200.

SRAM bit cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-1. SRAM cell 200 is thus alternatively referred to as a 6T SRAM bit cell. The 6T SRAM bit cell is used for illustration and to explain the features, but does not limit the embodiments or the appended claims. This non-limiting embodiment may be further extended to an 8T SRAM bit cell, a 10T SRAM bit cell, and to content addressable memory (CAM) bit cells.

In operation, pass-gate transistor PG-1 and pass-gate transistor PG-2 provide access to a storage portion of SRAM bit cell 200, which includes a cross-coupled pair of inverters, an inverter 210 and an inverter 220. Inverter 210 includes pull-up transistor PU-1 and pull-down transistor PD-1, and inverter 220 includes pull-up transistor PU-2 and pull-down transistor PD-2. In some implementations, pull-up transistors PU-1, PU-2 are configured as p-type FinFETs, and pull-down transistors PD-1, PD-2 are configured as n-type FinFETs. In some implementations, pass-gate transistors PG-1, PG-2 are also configured as n-type FinFETs.

A gate of pull-up transistor PU-1 interposes a source (electrically coupled with a power supply voltage ($V_{DD}$) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

When the SRAM bit cell 200 is read from, a positive voltage is placed on the word line WL, and the pass gates PG-1 and PG-2 allow the bit lines BL and BLB to be coupled to, and receive the data from, the storage nodes SN and SNB. Unlike a dynamic memory or DRAM cell, the SRAM bit cell does not lose its stored state during a read, so no data "write back" operation is required after a read. The bit lines BL and BLB form a complementary pair of data lines. As is known to those skilled in the art, these paired data lines may be coupled to a differential sense amplifier (not shown); and the differential voltage read from SRAM cells can be sensed and amplified, as is known in the art. This amplified sensed signal, which is at a logic level voltage, may then be output as read data to other logic circuitry in the device.

In forming the SRAM bit cell 200 in a semiconductor device, after the transistors are formed, the transistors may be interconnected to form circuits. These connections may be formed using horizontal conductors formed of metal layers that are separated from the substrate and the gate by dielectric layers. Further the metal layers are separated and electrically isolated from one another by interlevel dielectric layers (ILD) and intermetal dielectric layers (IMD). These dielectric layers may be low-k or high-k dielectric materials, for example. The connections between metal layers needed to couple the device nodes, such as the data storage nodes, or the bit line nodes, to the overlying conductors, are made vertically through the dielectric layers. Example connections are shown in FIG. 3.

Figure 3:
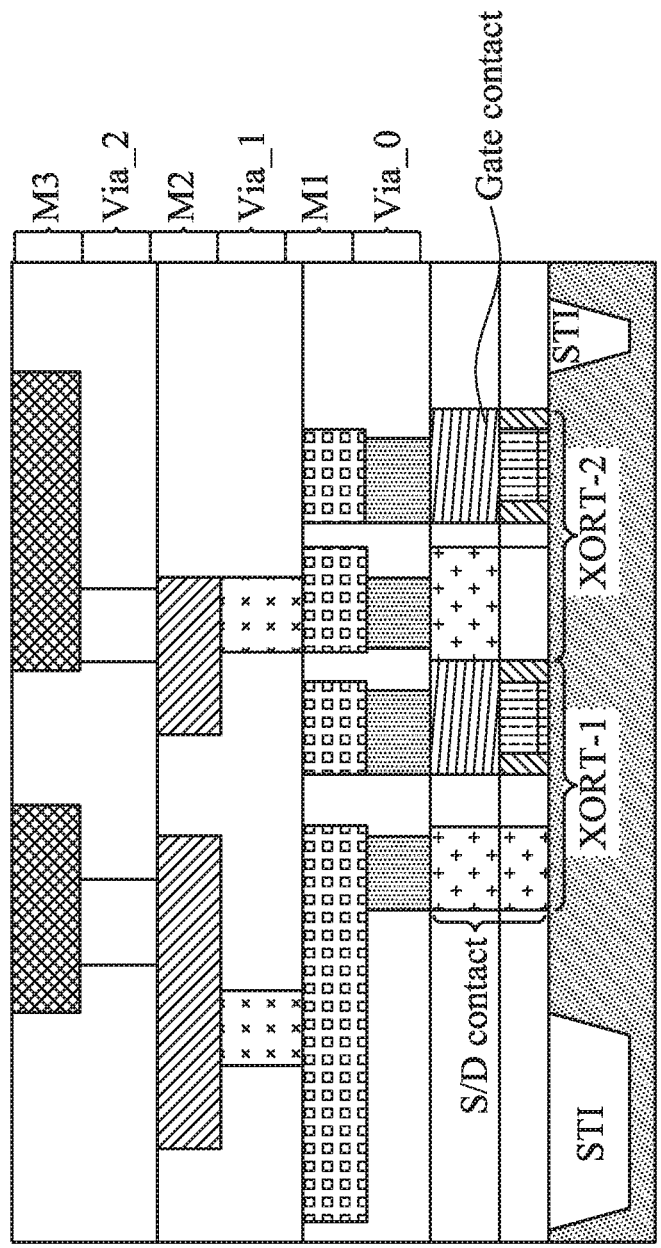
FIG. 3 is a cross-sectional view illustrating interconnection layers of an SRAM bit cell.

FIG. 3 illustrates a schematic cross-sectional view of a SRAM bit cell, in which layers are formed on a semiconductor substrate or wafer. It is noted that FIG. 3 is schematically illustrated to show various layers of interconnect structure and transistors, and may not reflect the actual cross-sectional view of a SRAM bit cell 200. The interconnect structure includes S/D and gate contact level, via levels Via_0, Via_1, and Via_2, and metal layers M1, M2, and M3. Each of the levels includes one or more dielectric layers and the conductive features formed therein. The conductive features that are at the same level may have top surfaces substantially level to each other, bottom surfaces substantially level to each other, and may be formed simultaneously. The vertical conductive feature in the S/D and gate contact level connecting gate electrodes of transistors (such as the illustrated exemplary transistors PG-1 and PU-2 in FIG. 2) to an overlying level (e.g., Via_0 level) is referred to as a gate contact. The vertical conductive features in the S/D and gate contact level connecting source and drain regions of transistors to an overlying level (e.g., Via_0 level) is referred to as an S/D contact. The gate contacts and S/D contacts may be formed from various conductors including, without limitation, metal nitrides, Cu, W, Al, AlCu, TiN, TiW, Ti, TaN, Ta, Pt, or combinations thereof.

Advanced semiconductor devices increasingly use FinFET transistors. A FinFET transistor has a three-dimensional gate structure. By forming the gate electrode including a dielectric layer and an electrode layer over a vertical "fin", the width of the transistor gate, W, which is directly proportional to performance of the transistor, may be increased using the vertical height of the fin, without correspondingly increasing the surface area needed for the device. Put another way, for a given W/L measure, the FinFET devices may be packed in a denser arrangement than conventional planar MOS devices having a corresponding W/L measure.

Figure 4:
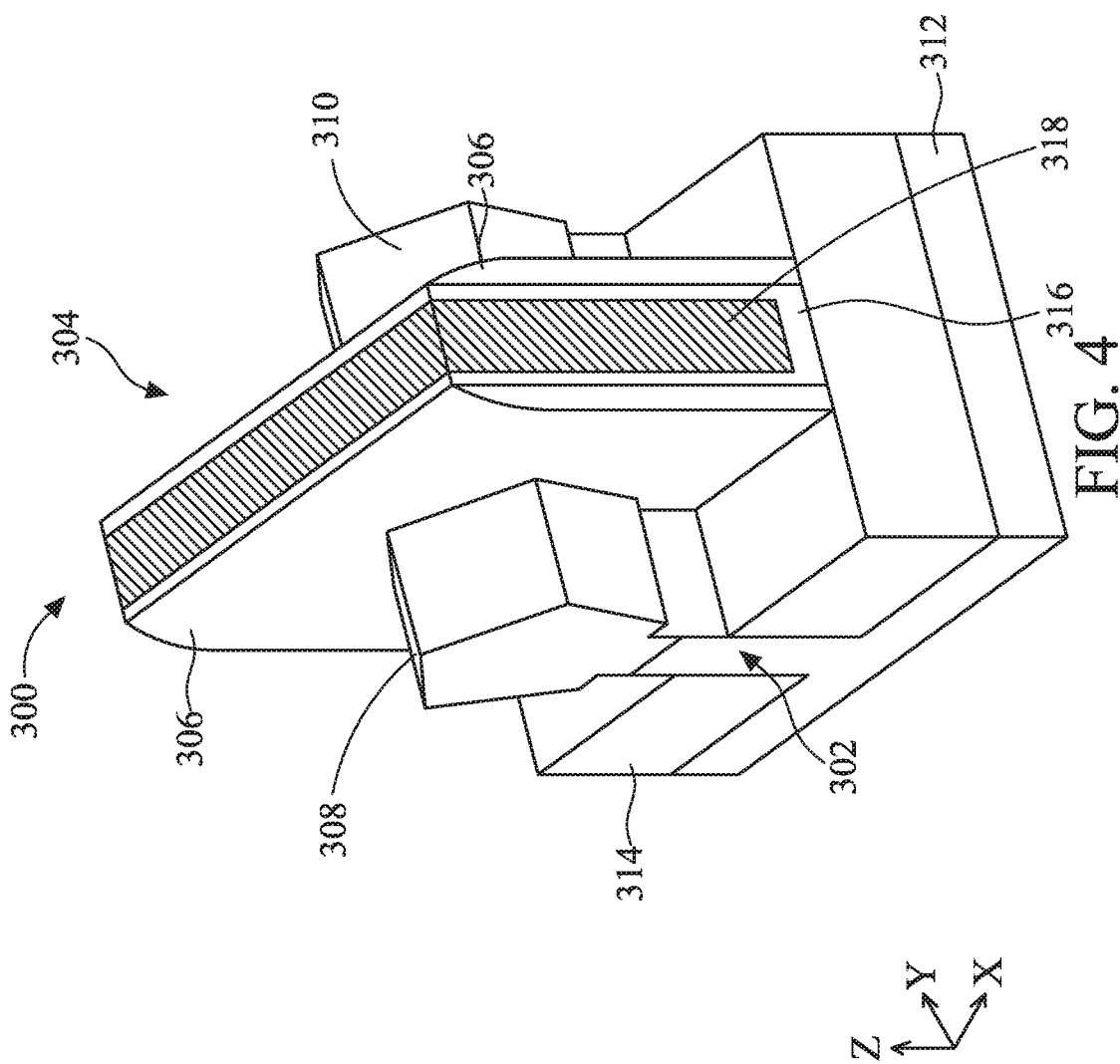
FIG. 4 is a perspective view of a fin field-effect transistor (FinFET) in accordance with some embodiments.

FIG. 4 illustrates a perspective view of a FinFET transistor 300, which may serve as any of the transistors in a SRAM bit cell 200 (FIG. 2), including pull-up transistor PU-1, pull-up transistor PU-2, pull-down transistor PD-1, pull-down transistor PD-2, pass-gate transistor PG-1, and pass-gate transistor PG-2. In some embodiments, FinFET 300 includes a semiconductor fin 302, a gate structure 304, spacers 306, a drain region 308, and a source region 310. Semiconductor fin 302 extends above a semiconductor substrate 312. Semiconductor fin 302 represents semiconductor fins 420A, 420B, 420C, 420D, 420E, and 420F in a layout of a SRAM bit cell 400 shown below in FIG. 5. In some embodiments, semiconductor substrate 312 and semiconductor fin 302 are made of the same material. For example, the substrate is a silicon substrate. In some embodiments, semiconductor fin 302 of FinFET 300 may be surrounded by isolating structure 314 formed on opposite sides of semiconductor fin 302. Isolating structure 314 may electrically isolate an active region (not shown) of FinFET 300 from other active regions. In some embodiments, isolating structure 314 are shallow trench isolation (STI), field oxide (FOX), or another suitable electrically insulating structure.

Still referring to FIG. 3, in some embodiments, gate structure 304, which includes a gate dielectric 316 and a gate electrode 318 formed over gate dielectric 316, is positioned over sidewalls and a top surface of semiconductor fin 302. Therefore, a portion of semiconductor fin 302 overlaps gate structure 304 may serve as a channel region of FinFET 300. In some embodiments, spacers 306 of FinFET 300 are positioned over sidewalls and a top surface of semiconductor fin 302. In addition, spacers 306 may be formed on opposite sides of gate structure 304. In some embodiments, spacers 306 are made of silicon nitride, silicon oxynitride, silicon carbide, another suitable material, or a combination thereof.

In some embodiments, portions of semiconductor fin 302 that are not covered by gate structure 304 and spacers 306 serve as a drain region 308 and a source region 310. In some embodiments, drain region 308 and source region 310 of p-type FinFETs, for example, pull-up transistor PU-1 and pull-up transistor PU-2 are formed by implanting the portions of semiconductor fin 302 that are not covered by gate structure 304 and spacers 306 with a p-type impurity such as boron, indium, or the like. In some embodiments, drain region 308 and source region 310 of n-type FinFETs, for example, pass-gate transistor PG-1, pass-gate transistor PG-2, pull-down transistor PD-1, and pull-down transistor PD-2 are formed by implanting the portions of semiconductor fin 302 that are not covered by gate structure 304 and spacers 306 with an n-type impurity such as phosphorous, arsenic, antimony, or the like.

In some embodiments, drain region 308 and source region 310 are formed by etching portions of semiconductor fin 302 that are not covered by gate structure 304 and spacers 306 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, drain region 308 and source region 310 may be formed of silicon germanium (SiGe) in some exemplary embodiments, while the remaining semiconductor fin 302 may be formed of silicon. In some embodiments, p-type impurities are in-situ doped in drain region 308 and source region 310 during the epitaxial growth of drain region 308 and source region 310 of p-type FinFET 300, for example, pull-up transistor PU-1 and pull-up transistor PU-2 in FIG. 2. In addition, n-type impurities are in-situ doped in drain region 308 and source region 310 during the epitaxial growth of drain region 308 and source region 310 of n-type FinFET 300, for example, pass-gate transistor PG-1, pass-gat transistor PG-2, pull-down transistor PD-1, and pull-down transistor PD-2 in FIG. 2.

In some other embodiments, pass-gate transistors PG-1 and PG-2, pull-up transistors PU-1 and PU-2, and pull-down transistors PD-1 and PD-2 of SRAM bit cell 200 in FIG. 2 are planar MOS devices.

Figure 5:
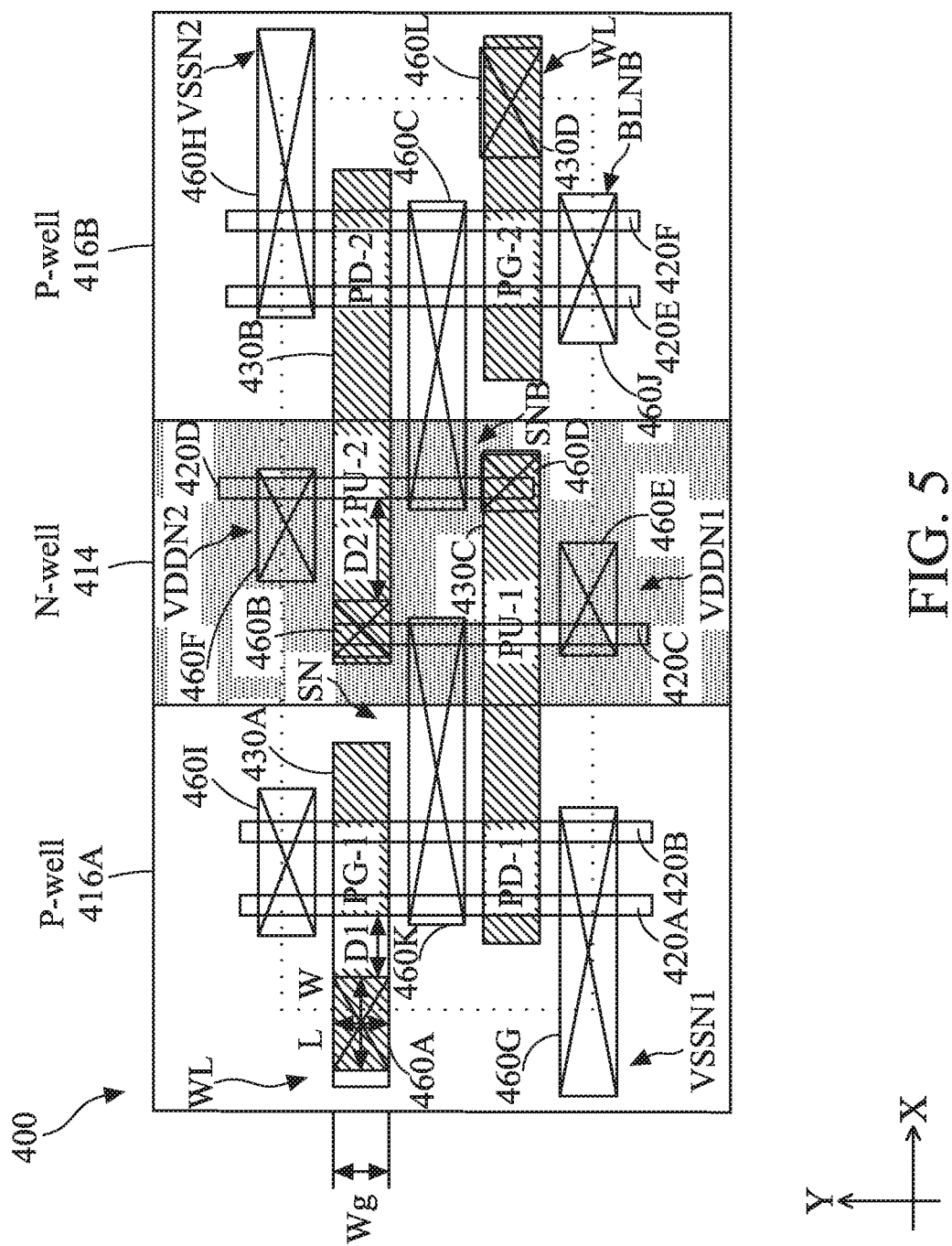
FIG. 5 is a plan view of a SRAM bit cell, which can be implemented in a memory cell of a memory macro, according to various aspects of the present disclosure.

FIG. 5 is a layout of a SRAM bit cell 400, which can be implemented in a memory cell of a SRAM array, according to various aspects of the present disclosure. In some implementations, SRAM bit cell 400 is implemented in one or more memory cells 106 of memory macro 102 (FIG. 1), or as SRAM bit cell 200 (FIG. 2). FIG. 4 has been simplified for the sake of clarity to better understand the inventive concepts of the present disclosure. Additional features can be added in SRAM bit cell 400, and some of the features described below can be replaced, modified, or eliminated in other embodiments of SRAM bit cell 400.

In FIG. 5, SRAM bit cell 400 includes six transistors: a pass-gate transistor PG-1, a pass-gate transistor PG-2, a pull-up transistor PU-1, a pull-up transistor PU-2, a pull-down transistor PD-1, and a pull-down transistor PD-1. SRAM bit cell 400 is thus alternatively referred to as a 6T SRAM cell. SRAM bit cell 400 includes a region 414 that provides an n-well between a region 416A and a region 416B that each provides a p-well (collectively as region 416). Pull-up transistors PU-1, PU-2 are disposed over the region 414; pull-down transistor PD-1 and pass-gate transistor PG-1 are disposed over the region 416A; and pull-down transistor PD-2 and pass-gate transistor PG-2 are disposed over the region 416B. In some implementations, pull-up transistors PU-1, PU-2 are configured as p-type FinFETs, and pull-down transistors PD-1, PD-2 and pass-gate transistors PG-1, PG-2 are configured as n-type FinFETs. In some embodiments, each transistor may be in a form similar to the FinFET 300 (FIG. 4). In the illustrated embodiment, pull-down transistor PD-1 and pass-gate transistor PG-1 are multi-fin FinFETs (including, for example, a fin 420A and a fin 420B), pull-up transistor PU-1 is a single fin FinFET (including, for example, a fin 420C), pull-up transistor PU-2 is a single fin FinFET (including, for example, a fin 420D), and pull-down transistor PD-2 and pass-gate transistor PG-2 are multi-fin FinFETs (including, for example, a fin 420E and a fin 420F). A gate structure 430A is disposed over fins 420A, 420B; a gate structure 430C is disposed over fins 420A-420D; a gate structure 430B is disposed over fins 420C-420F; and a gate structure 430D is disposed over fins 420E-420F. A gate of pass-gate transistor PG-1 is formed from gate structure 430A, a gate of pull-down transistor PD-1 is formed from the gate structure 430C, a gate of pull-up transistor PU-1 is formed from the gate structure 430C, a gate of pull-up transistor PU-2 is formed from the gate structure 430B, a gate of pull-down transistor PD-2 is formed from the gate structure 430B, and a gate of pass-gate transistor PG-2 is formed from the gate structure 430D.

An S/D contact 460K electrically connects a drain region of pull-down transistor PD-1 (formed by fins 420A, 420B (which can include n-type epitaxial source/drain features)) and a drain region of pull-up transistor PU-1 (formed by fin 420C (which can include p-type epitaxial source/drain features)), such that a common drain of pull-down transistor PD-1 and pull-up transistor PU-1 form a storage node SN. A gate contact 460B electrically connects a gate of pull-up transistor PU-2 (formed by gate structure 430B) and a gate of pull-down transistor PD-2 (also formed by gate structure 430B) to storage node SN. An S/D contact 460C electrically connects a drain region of pull-down transistor PD-2 (formed by fins 420E, 420F (which can include n-type epitaxial source/drain features)) and a drain region of pull-up transistor PU-2 (formed by fin 420D (which can include p-type epitaxial source/drain features)), such that a common drain of pull-down transistor PD-2 and pull-up transistor PU-2 form a storage node SNB. A gate contact 460D electrically connects a gate of pull-up transistor PU-1 (formed by gate structure 430C) and a gate of pull-down transistor PD-1 (also formed by gate structure 430C) to storage node SNB. An S/D contact 460E electrically connects a source region of pull-up transistor PU-1 (formed by fin 420C (which can include p-type epitaxial source/drain features)) to a power supply voltage $V_{DD}$ at a voltage node VDDN1, and an S/D contact 460F electrically connects a source region of pull-up transistor PU-2 (formed by fin 420D (which can include p-type epitaxial source/drain features)) to power supply voltage $V_{DD}$ at a voltage node VDDN2. An S/D contact 460G electrically connects a source region of pull-down transistor PD-1 (formed by fins 420A, 420B (which can include n-type epitaxial source/drain features)) to a power supply voltage $V_{SS}$ at a voltage node VSSN1, and a device-level contact 460H electrically connects a source region of pull-down transistor PD-2 (formed by fins 420E, 420F (which can include n-type epitaxial source/drain features)) to power supply voltage $V_{SS}$ at a voltage node VSSN2. A S/D contact 460I electrically connects a source region of pass-gate transistor PG-1 (formed by fins 420A, 420B (which can include n-type epitaxial source/drain features)) to a bit line (generally referred to as a bit line node BLN), and an S/D contact 460J electrically connects a source region of pass-gate transistor PG-2 (formed by fins 420E, 420F (which can include n-type epitaxial source/drain features)) to a complementary bit line (generally referred to as a bit line node BLNB). A gate contact 460A electrically connects a gate of pass-gate transistor PG-1 (formed by gate structure 430A) to a word line WL (generally referred to as a word line node WL), and a gate contact 460L electrically connects a gate of pass-gate transistor PG-2 (formed by gate structure 430D) to the word line.

Among gate contacts 460A, 460B, 460D, and 460L, gate contacts 460B and 460D are over the region 414 that provides an n-well, and gate contacts 460A and 460L are over the regions 416A and 416B that provide p-wells. The widths of gate contacts W are measured in gate pitch direction (Y-direction). The lengths of gate contacts L are measured in gate lengthwise direction (X-direction). A distance between a gate contact and an adjacent fin (e.g., D1 measured from an edge of the gate contact 460A to an opposing edge of the fin 420A, or D2 measured from an edge of the gate contact 460B to an opposing edge of the fin 420D) is measured in gate lengthwise direction (X-direction). The width of the gate structure 430A-D is denoted as the gate width Wg. Reference to the gate width Wg, in the illustrated embodiment, the gate contacts 460B and 460D each has a square shape with W and L roughly equal Wg (W=L≈Wg), while the gate contacts 460A and 460L each has a rectangular (or elongated) shape with W roughly equals Wg (W≈Wg) and L about 2 times to about 3 times of W. In other words, the gate contacts above a p-well for n-type transistors has a larger length to width ratio than the gate contacts above an n-well for p-type transistors, in the illustrated embodiment. As will be shown later on, in a cross-sectional view, the gate contacts above a p-well also extend deeper into the gate electrode underneath than the gate contacts above an n-well. The elongated shape of the gate contacts 460A and 460L also reduces the distance D1 between the gate contact and respective adjacent fins. In some embodiments, the distance D2 between the gate contact 460B and the fin 420D is about 1.1 times to about 2 times of Wg, while the distance D1 between the gate contact 460A and the fin 420A is about −0.4 times to about 0.8 times of Wg. The benefits of elongated and deeper gate contacts over a p-well for n-type transistors will become evident in a later section of the present disclosure.

Figure 6:
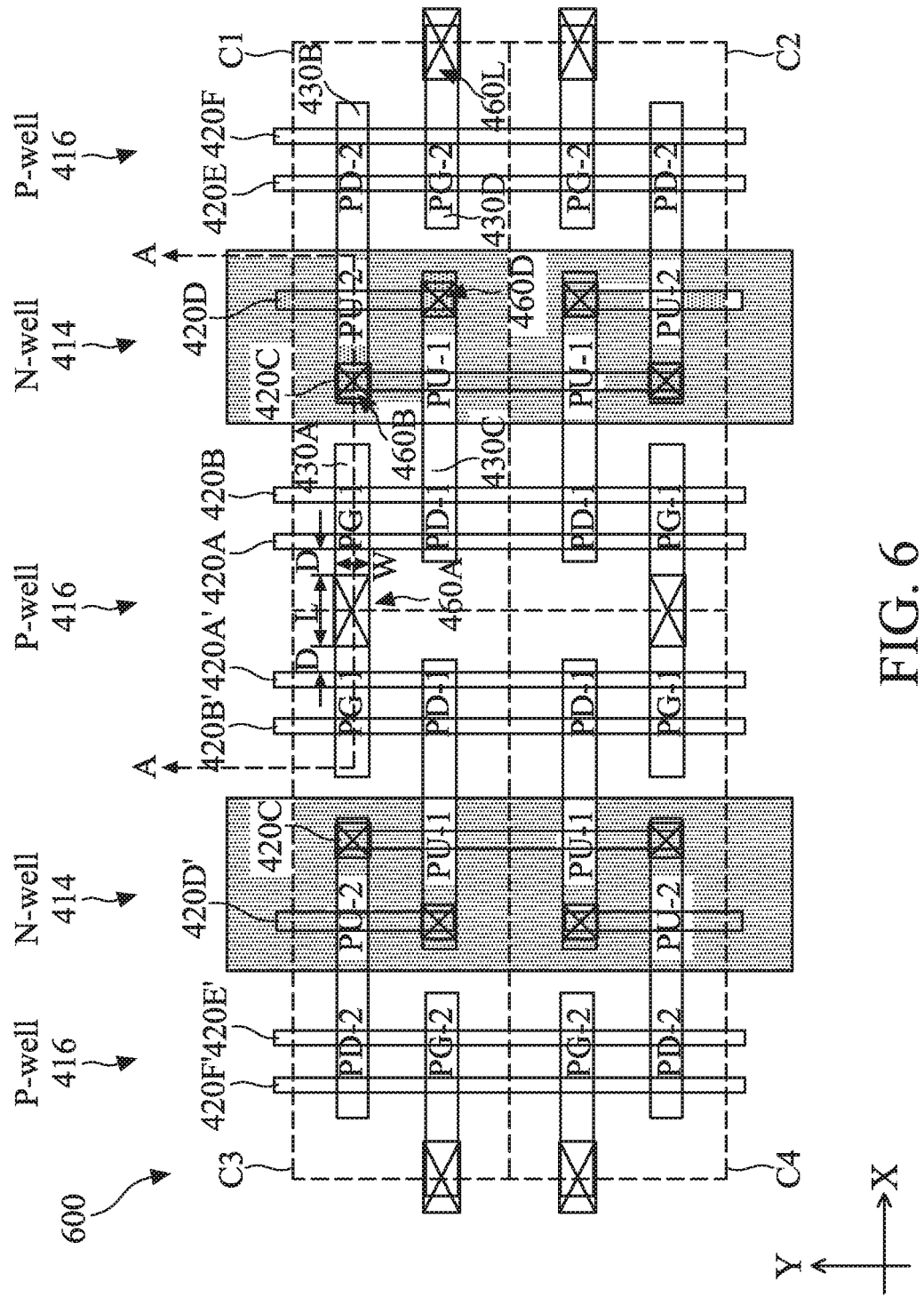
FIG. 6 is a plan view of a 2×2 memory array tiled by the SRM bit cell of FIG. 5.

FIG. 6 depicts a semiconductor device 600 (or device 600) that includes an example 2×2 array of SRAM bit cells C1, C2, C3, and C4. Each SRM bit cell in the array may use the layout of SRAM bit cell 400 as depicted in FIG. 5 according to an embodiment. It should be noted that other SRAM bit cell layouts may be similarly used. The device 600 may include the memory macro 102, or as the device 100 as depicted in FIG. 1. FIG. 6 has been simplified for the sake of clarity to better understand the inventive concepts of the present disclosure. For example, S/D contacts in a SRAM cell 400 as depicted in FIG. 5 are omitted. Also, reference numerals in FIG. 5 are also repeated in FIG. 6 for ease of understanding, such as fins 420A-F, gate structures 430A-D, and gate contacts 460A, 460B, 460D, 460L.

The example 2×2 array includes regions 414 and 416. In the present embodiment, the region 416 provides p-well for forming n-type FinFET devices (including transistors PG-1 and PD-1) and the region 414 provides n-well for forming p-type FinFET devices (including transistors PU-1 and PU-2). Therefore, the region 416 is also referred to as the NFET region 416, and the region 414 is also referred to as the PFET region 414.

The example 2×2 array includes regions 414 and 416 alternately arranged along an x-direction. In other words, every PFET region 414 is next to an NFET region 416 which is next to another PFET region 414, and this pattern repeats. For ease of reference, a column is referred to as being in the Y-direction in this example. Thus, bit cells C1 and C2 are in a first column, and bit cells C3 and C4 are in a second column. As depicted, adjacent cells in the array are mirror images along a border between the adjacent cells. Some active areas in an SRAM bit cell may extend through multiple SRAM bit cells in a column. In FIG. 6, the active area (fins 420A and 420B) for transistors PG-1 and PD-1 in SRAM bit cell C1 extends through bit cell C2 as the active area for its transistors PD-1 and PG-1. The active area (fin 420C) for transistor PU-1 in bit cell C1 extends through bit cell C2 as the active area for its transistor PU-1. Similarly, the active area (fins 420A and 420B) for transistors PG-1 and PD-1 in SRAM bit cell C3 extends through bit cell C4 as the active area for its transistors PD-1 and PG-1. The active areas (denoted as fins 420A'-420F') extending through bit cells C3 and C4 are similarly arranged as their counterparts 420A-420F.

By having the bit cells in the configuration in FIG. 6, active areas can be uniformly spaced and can uniformly extend throughout an array of bit cells. For example, the spacing between active areas in the x-direction can be uniform. Further, the active areas can extend longitudinally across multiple bit cells without being interrupted by an isolation area. This configuration can improve the uniformity of an array layout, and thereby, avoid lithography problems that may arise in forming the active areas, particularly fins for FinFET active areas and in small technology nodes.

Figure 7:
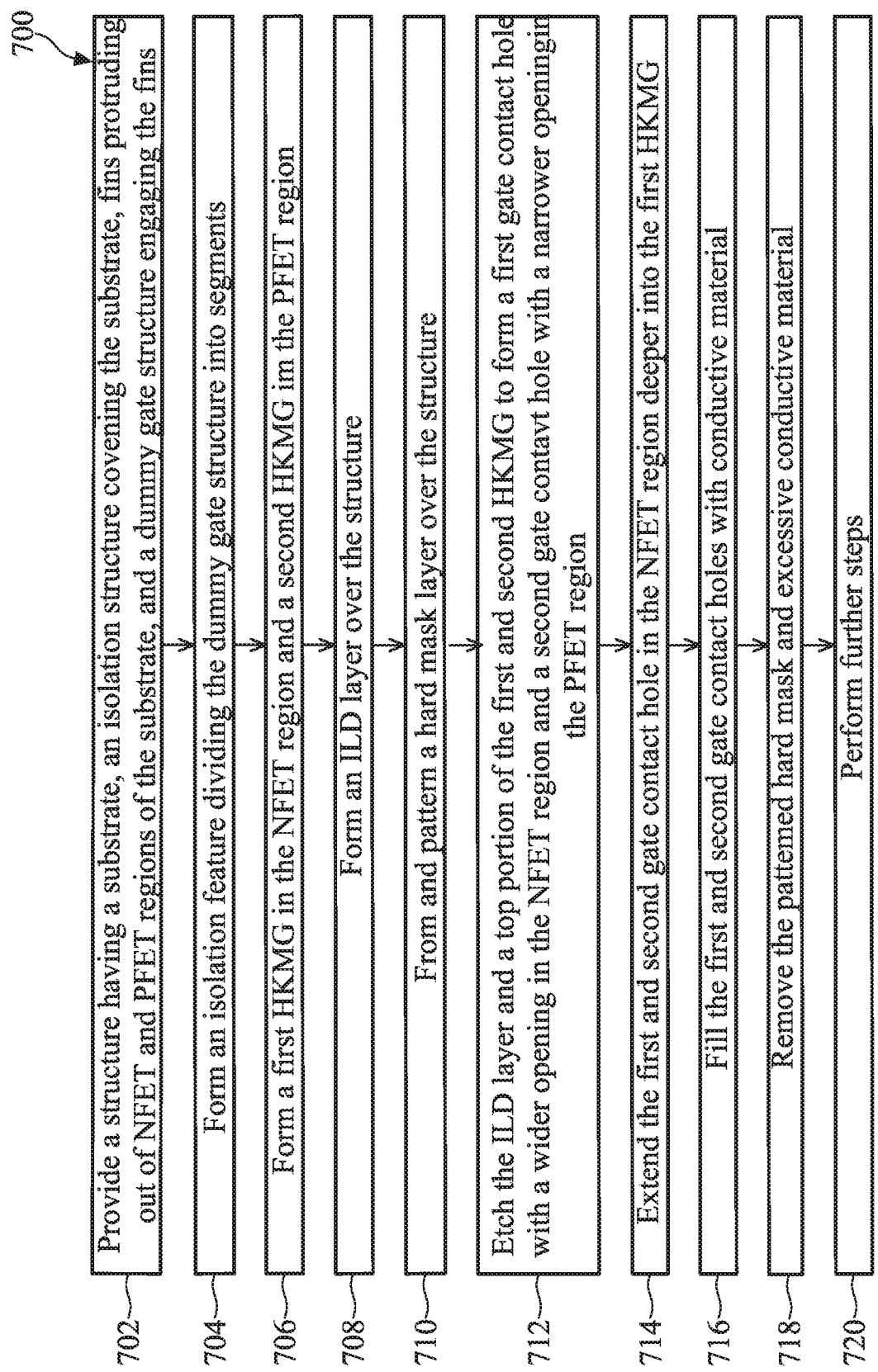
FIG. 7 shows a flow chart of a method for forming semiconductor devices, according to aspects of the present disclosure.

FIG. 7 illustrates a flow chart of a method 700 for forming the device 600 depicted in FIG. 6 in accordance with some embodiments. The method 700 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 700 is described below in conjunction with FIG. 6 and FIGS. 8-18, which illustrate various cross-sectional views of the device 600 during fabrication steps according to the method 700.

Particularly, FIGS. 8-18 are cross-sectional views of a portion of the device 600 along the A-A line as shown in FIG. 6 (a cut across NFET region 416 and PFET region 414 along the lengthwise direction of the gate structures 430A and 430B).

The device 600 is provided for illustration purposes and does not necessarily limit the embodiments of the present disclosure to any number of devices, any number of regions, or any configuration of structures or regions. Furthermore, the device 600 as shown in FIGS. 6 and 8-18 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS)

transistors, bipolar transistors, high voltage transistors, high frequency transistors, other memory cells, and combinations thereof.

Figure 8:
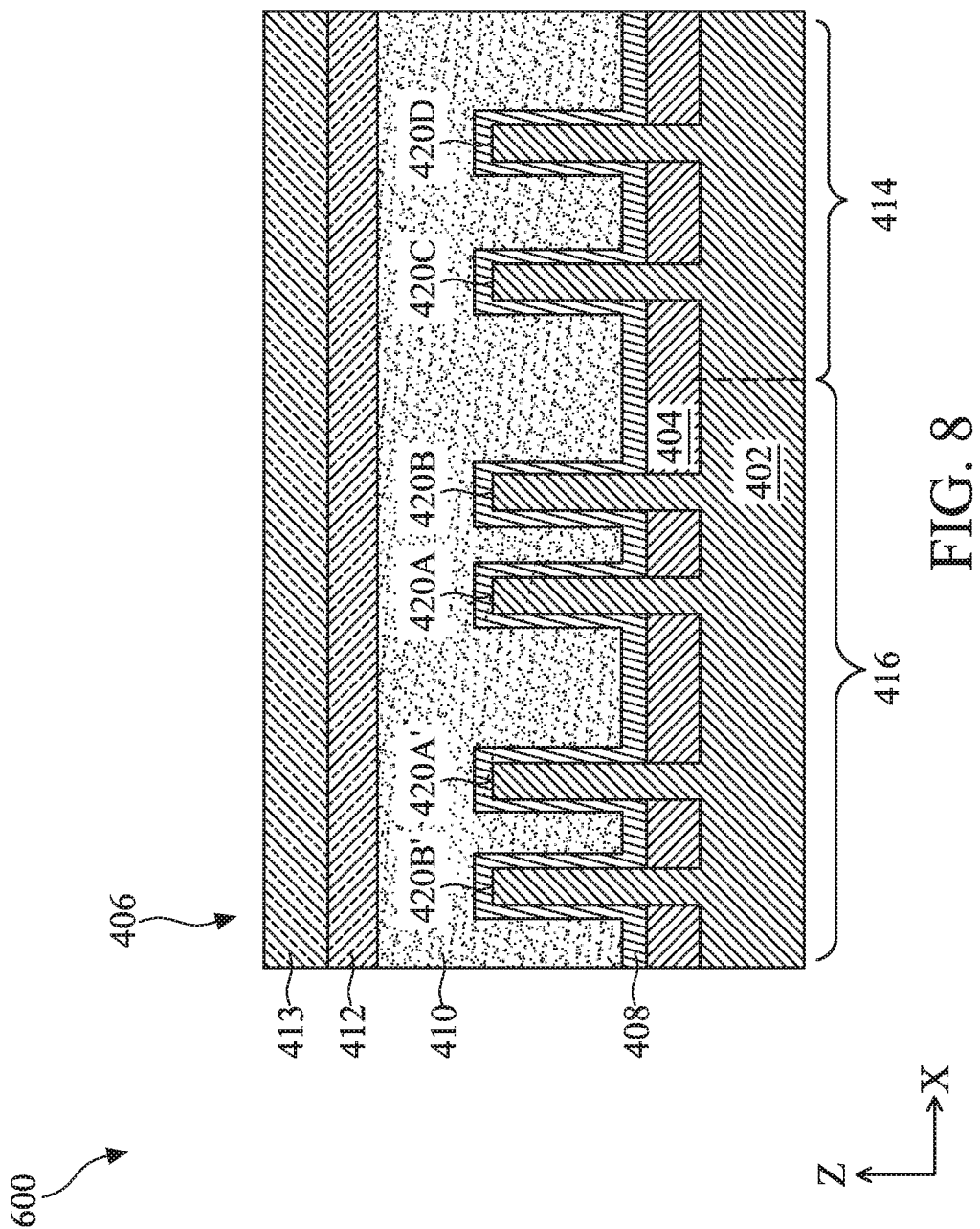
FIGS. 8-18 illustrate cross-sectional views of a semiconductor structure during a fabrication process according to the method of FIG. 7, in accordance with some embodiments.

Referring to FIGS. 7 and 8, at operation 702, the method 700 provides, or is provided with, a device 600 having a substrate 402, fins 420 (including fins 420A, 420B, 420C, 420D, 420A', and 420B') protruding out of the substrate 402, an isolation structure 404 over the substrate 402 and between the fins 420. Each of the fins 420 includes two S/D regions and a channel region sandwiched between the two S/D regions. The device further includes a gate structure 406 engaging the channel regions of the fins 420. The gate structure 406 is a placeholder for a high-k metal gate to be formed in a later process. The gate structures 406 is also referred to as a dummy gate structure or a dummy gate stack.

The substrate 402 is a silicon (Si) substrate in the present embodiment. In alternative embodiments, the substrate 402 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 402 may include silicon on insulator (SOI) substrate, be strained and/or stressed for performance enhancement, include epitaxial regions, doped regions, and/or include other suitable features and layers.

The substrate 402 includes two regions, the NFET region 416 providing p-well for forming n-type FinFET devices and the PFET region 414 providing n-well for forming p-type FinFET devices (with a boundary line represented by a dotted line therebetween in FIG. 8). The NFET region 416 and PFET region 414 each includes multiple fins 420 separated by the isolation structure 404, such as the fins 420A, 420B, 420A', 420B' in the NFET region 416 and the fins 420C, 420D in the PFET region 414. It is understood that the present disclosure is not limited to any particular number of fins and regions, or to any particular device configurations. For example, though the device 600 as illustrated is a FinFET device, the present disclosure may also provide embodiments for fabricating planar FET devices or gate-all-around (GAA) FET devices.

The fins 420 are oriented lengthwise along Y-direction and spaced from each other along X-direction perpendicular to the Y-direction. Each of the fins 420 may be designed for forming n-type FinFETs or p-type FinFETs depending on respective regions therein. The fins 420 may be patterned by any suitable method. For example, the fins 420 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 420. For example, the masking element may be used for etching recesses into the substrate 402, leaving the fins 420 on the substrate 402. The etching process may include dry etching, wet etching, reactive ion etching (RIE), and/or other suitable processes.

The isolation structure 404 may include silicon oxide ($SiO_2$), silicon nitride (SiN), silicon oxynitride (SiON), fluoride-doped silicate glass (FSG), a low-k dielectric material, and/or other suitable insulating material. The isolation structure 404 may be shallow trench isolation (STI) features. In an embodiment, the isolation structure 404 is formed by etching trenches in the substrate 402 (e.g., as part of the process of forming the fins 420), filling the trenches with an insulating material, and performing a chemical mechanical planarization (CMP) process to the substrate 402 including the insulating material. Other types of isolation feature may also be suitable, such as field oxide and LOCal Oxidation of Silicon (LOCOS).

The dummy gate structure 406 is oriented lengthwise along the X-direction. The dummy gate structure 406 engage the fins 420 in their respective channel regions. The dummy gate structure 406 is a multi-layer structure. For example, the dummy gate structure 406 may include an interfacial layer 408, a gate electrode layer 410 over the interfacial layer, and two hard mask layers 412 and 413.

The interfacial layer 408 may include a dielectric material such as silicon oxide layer (e.g., $SiO_2$) or silicon oxynitride (e.g., SiON), and may be formed by chemical oxidation, thermal oxidation, atomic layer deposition (ALD), CVD, and/or other suitable methods. The gate electrode layer 410 may include poly-crystalline silicon (poly-Si) and may be formed by suitable deposition processes such as low-pressure chemical vapor deposition (LPCVD) and plasma-enhanced CVD (PECVD). Each of the hard mask layers 412 and 413 may include one or more layers of dielectric material such as silicon oxide and/or silicon nitride, and may be formed by CVD or other suitable methods. The various layers in the dummy gate structure 406 may be patterned by photolithography and etching processes.

Figure 9:
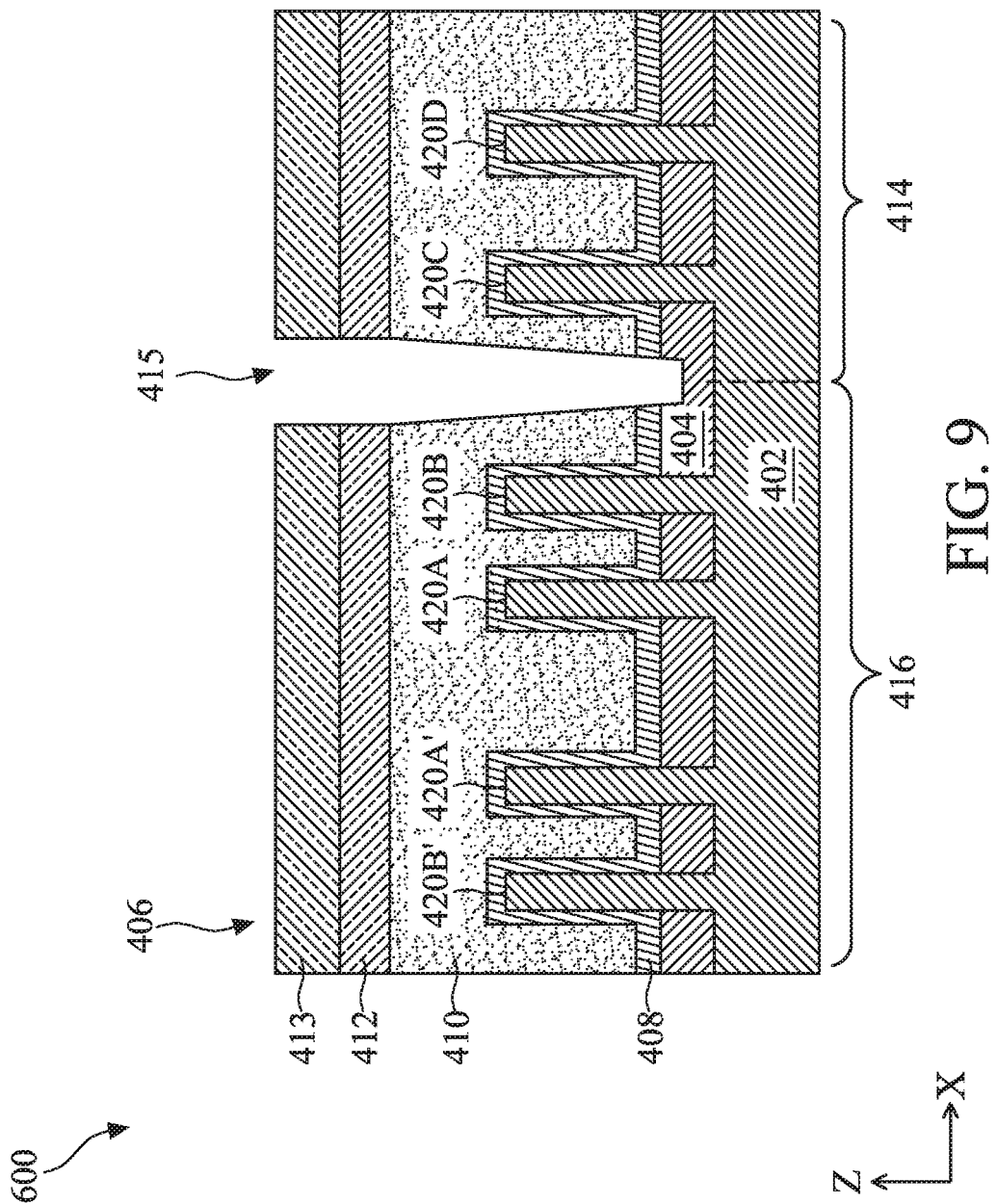
Figure 10:
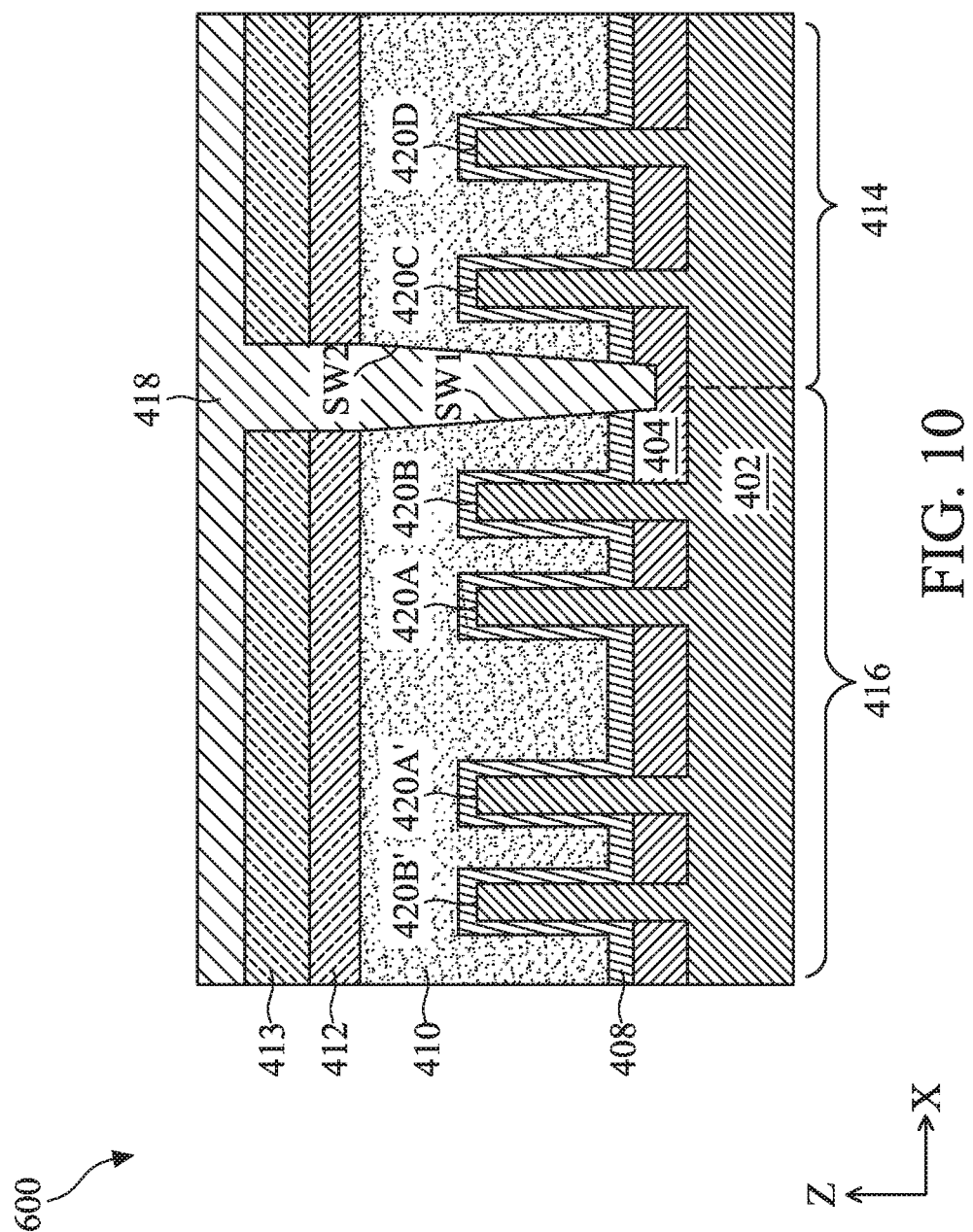

Referring to FIGS. 7 and 9-11, at operation 704, the method 700 forms an isolation feature dividing the dummy gate structure 406 into two segments, one over the NFET region 416 and another over the PFET region 414. Operation 704 may first remove a portion of the dummy gate structure 406 and a top portion of the isolation structure 404 to form a trench 415, such as shown in FIG. 9. The operation 704 may include one or more etching processes that are selective to the materials in the dummy gate structure 406 and the isolation structure 404. The etching processes may include dry etching, wet etching, reactive ion etching, or other suitable etching methods. Subsequently, operation 704 fills the trench 415 with one or more dielectric materials to form a dielectric layer 418, as shown in FIG. 10. In the present embodiment, the outer portion (near sidewalls SW1 and SW2) of the dielectric layer 418 includes silicon nitride and is free of oxygen or oxide. The dielectric layer 114 may include some oxide in the inner portion thereof in some embodiments. Alternatively, the dielectric layer 114 may include one uniform layer of silicon nitride and is free of oxide. The dielectric layer 418 may be deposited using CVD, PVD, ALD, or other suitable methods. In the present embodiment, the dielectric layer 418 is deposited using ALD to ensure that it completely fills the trench 415.

Figure 11:
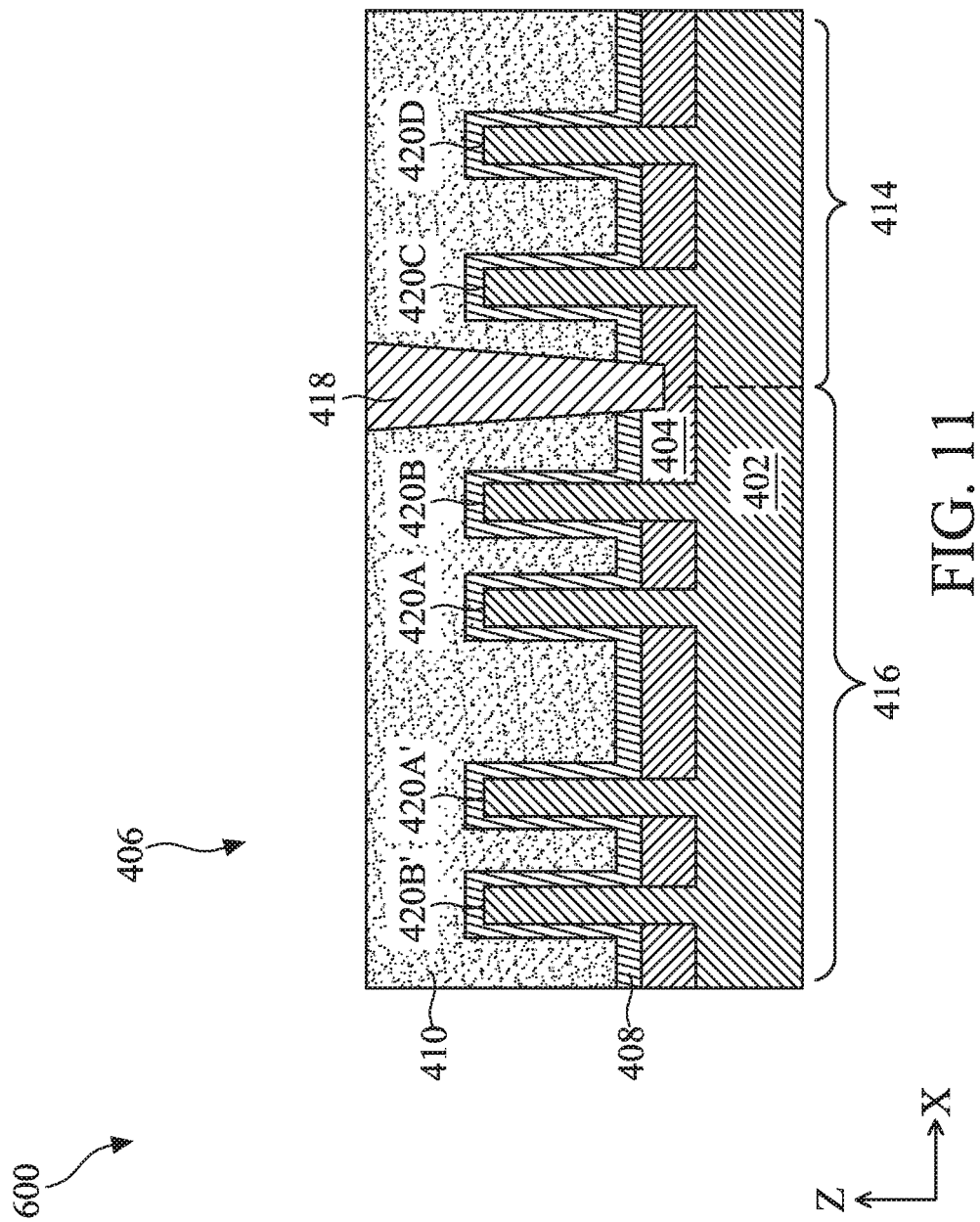

Operation 704 further performs one or more CMP processes to remove excessive dielectric layer 418 (the portion outside the trench 415) and the hard mask layers 412 and 413. In an embodiment, the hard mask layer 412 serves as a CMP stop layer when the hard mask layer 413 is removed by a CMP process. The resulting structure is shown in FIG. 11. After operation 704, the dielectric layer 418 is denoted as isolation feature 418. The isolation feature 418 divides the dummy gate structure 406 into two segments that will subsequently be replaced by two high-k metal gates.

Figure 12:
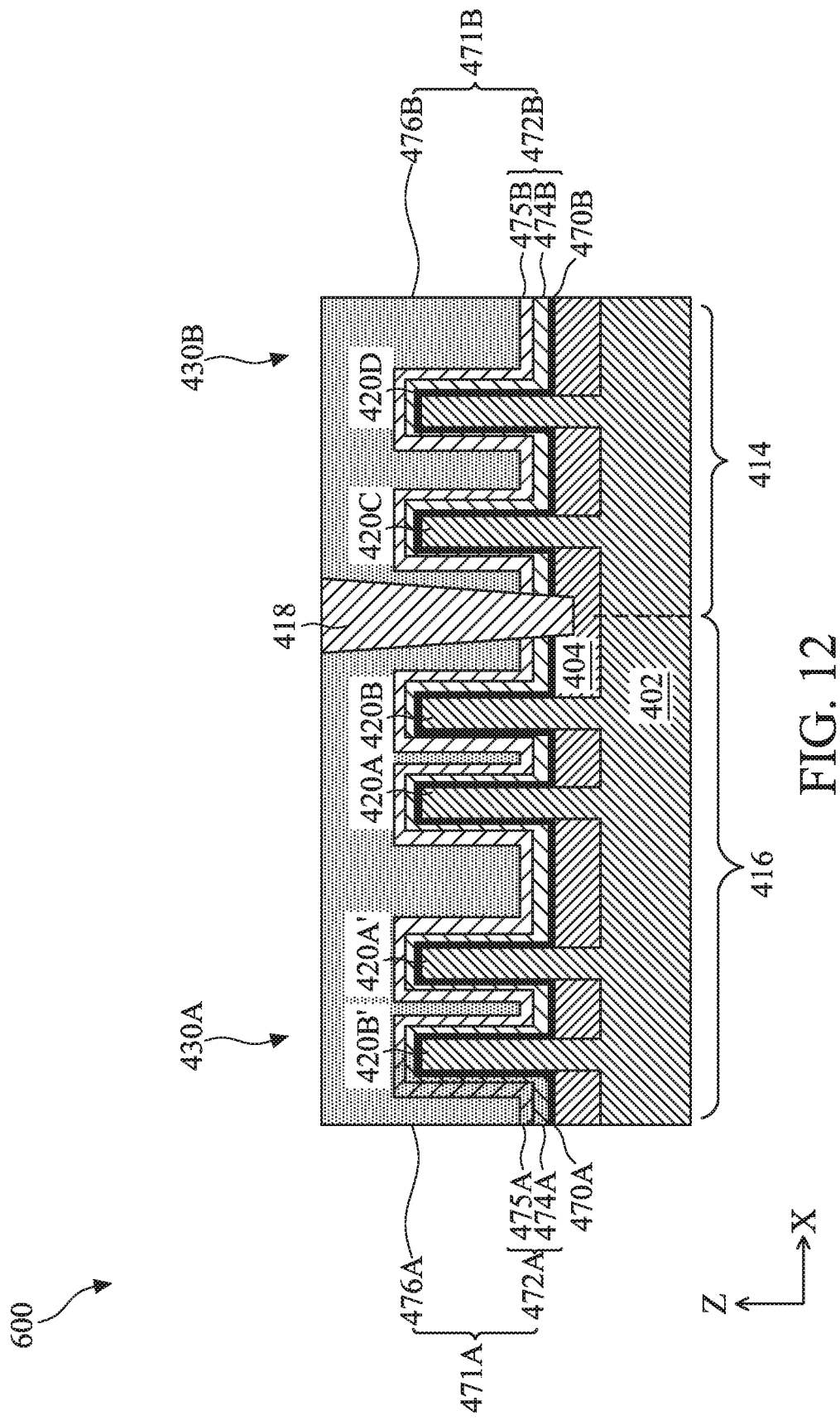

Referring to FIGS. 7 and 12, at operation 706, the method 700 removes the dummy gate structures 406 to form gate trenches (not shown) and deposits high-k metal gates 430A and 430B (FIG. 6) in the gate trenches. The high-k metal gate 430A engages fins 420B', 420A', 420A, 420B in the NFET region 416 to form n-type transistors PG-1. The high-k metal gate 430B engages fins 420C and 420D in the PFET region 414 to form p-type transistors PU-2.

The high-k metal gate 430A includes a high-k dielectric layer 470A and a gate electrode layer 471A. Similarly, the high-k metal gate 430B includes a high-k dielectric layer 470B and a gate electrode layer 471B. Each of the high-k dielectric layers 470A and 470B may further include an interfacial layer (e.g., silicon dioxide or silicon oxynitride) between the respective high-k dielectric layer and the fins 420. The interfacial layer may be formed using chemical oxidation, thermal oxidation, ALD, CVD, and/or other suitable methods. The high-k dielectric layers 470A and 470B may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The high-k dielectric layers 470A and 470B may be deposited using CVD, ALD and/or other suitable methods.

The gate electrode layer 471A includes one or more metal layers, such as a work function layer 472A and a metal fill layer 476A. Similarly, the gate electrode layer 471B includes one or more metal layers, such as a work function layer 472B and a metal fill layer 476B. The work function layer determines the work function of the high-k metal gates, and includes at least one layer, or a plurality of layers formed of different materials. The material of the work function layer is selected according to whether the respective transistor is an n-type transistor or a p-type transistor. For example, the work function layer 472A (of the n-type FinFET) may include a first work function layer 474A (e.g., a TiN layer) and a second work function layer 475A (e.g., a TiAl layer) over the first work function layer 474A. The work function layer 472B (of the p-type FinFET) may include a first work function layer 474B (e.g., a TiN layer, a TaN layer, or a TiN layer over a TaN layer) and a second work function layer 475B (e.g., a TiAl layer) over the first work function layer 474B. The work function layers 472A and 472B may be deposited by ALD, CVD, PVD, and/or other suitable methods. In some embodiments, each of the work function layers 472A and 472B includes a TiAl layer over a TiN layer, but with different thicknesses in NEFT and PFET regions to create different work functions. In one example, the TiN layer (i.e., the first work function layer 474A) in the NFET region 416 is thinner than the TiN layer (i.e., the second work function layer 475B) in the PFET region 414, such as with a thickness ratio from about 1:1.1 to about 1:10. Such a range provides a good compromise of effective threshold voltage tuning and acceptable work function layer thickness, such that when the ratio is larger than 1:1.1 the threshold voltage of p-type transistor may become too high and when the ratio is smaller than 1:10, the thickness of the TiN layer in the PFET region 414 may become too thick to deposit in the gate trench. Further, the TiAl layer (i.e., the second work function layer 475A) in the NFET region 416 is thicker than the TiAl layer (i.e., the second work function layer 475B) in the PFET region 414, such as with a thickness ration from about 1.1:1 to about 10:1. Again, such a range provides a good compromise of effective threshold voltage tuning and acceptable work function layer thickness, such that when the ratio is smaller than 1.1:1 the threshold voltage of n-type transistor may become too high and when the ratio is larger than 10:1, the thickness of the TiAl layer in the NFET region 416 may become too thick to deposit in the gate trench.

In some embodiments, after the deposition of the work function layers 472A and 472B, a barrier layer, which may be another TiN layer, is formed. The metal fill layers 476A and 476B may include aluminum (Al), tungsten (W), cobalt (Co), and/or other suitable materials. After the formation of metal fill layers 476A and 476B, a planarization process such as a CMP process or a mechanical grinding process is performed, so that excessive filling metal materials over the isolation feature 418 are removed and the isolation feature 418 is exposed thereafter.

Threshold voltage (Vt) of a transistor is mainly determined by the material and thickness of a work function metal layer. For example, for n-type transistors with a work function layer comprising TiN, thinner the TiN layer often results in a lower Vt. On the other hand, for a given Vt, the thickness of the TiN layer is also determined. Usually a thin TiN layer is desired to facilitate its deposition in a high-aspect-ratio gate trench. Sometimes this determined thickness may not be thin enough and poses a challenge in its deposition. As will be described in more details below, during the gate contact formation, openings for gate contacts of n-type transistors will be intentionally elongated and extended deeper to introduce more oxidization to aluminum-containing work function layer 475A, which would increase Vt if no other counter measures taken. Consequently, to offset such Vt increasement, the thickness of the TiN layer can be further reduced, resulting in a thinner TiN layer. Accordingly, in some embodiments, the thickness of the work function layer 474A in n-type transistors is allowed to be thinner than the thickness of the work function layer 474B in p-type transistors.

Figure 13:
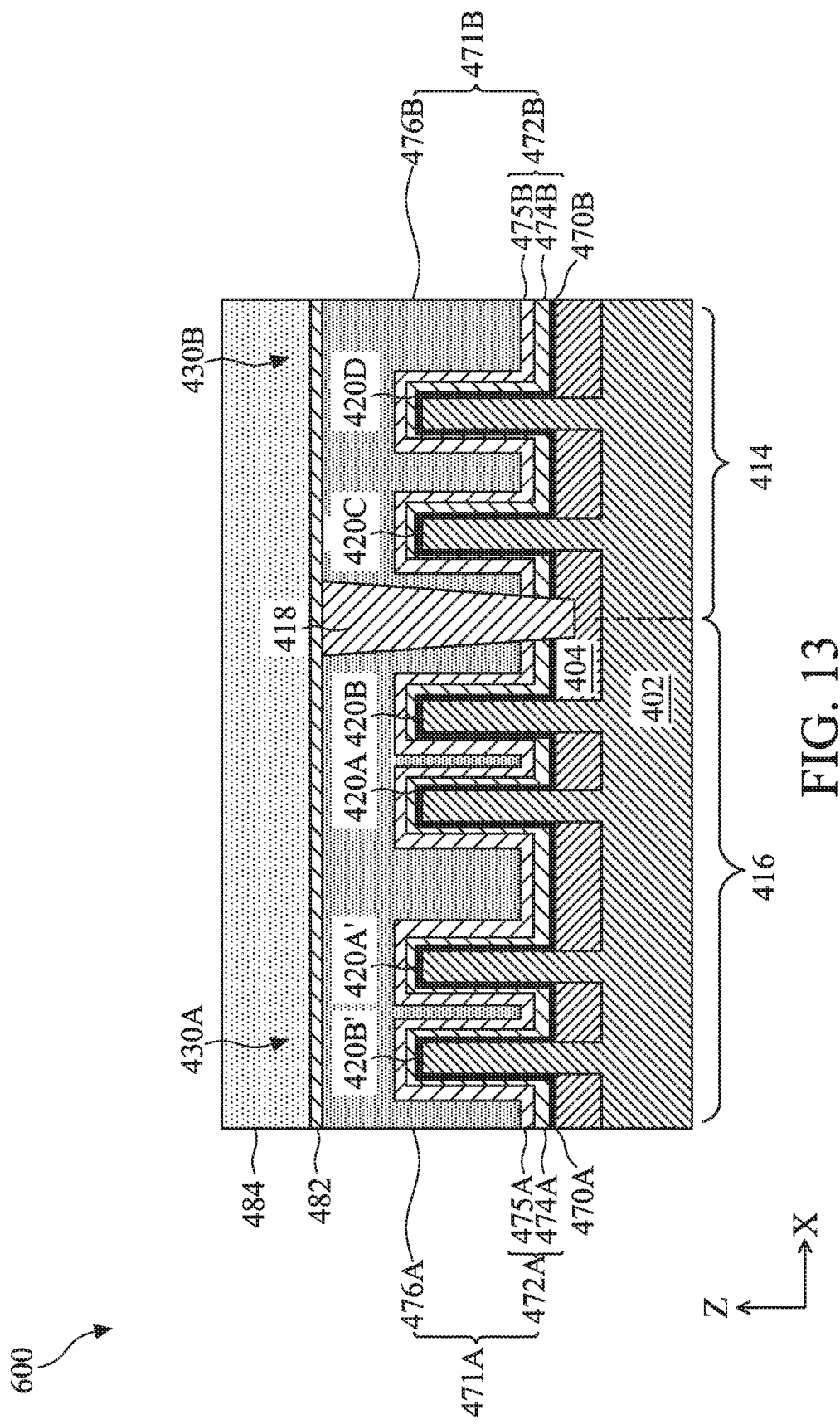

Referring to FIGS. 7 and 13, at operation 708, the method 700 forms an etch stop layer 482 and an interlayer dielectric layer (ILD) 484 over the device 600. The etch stop layer 482 may comprise silicon carbide, silicon oxynitride, silicon carbo-nitride, or the like. The ILD 484 may include a material selected from PSG, BSG, BPSG, Fluorine-doped Silicon Glass (FSG), TEOS, or other non-porous low-k dielectric materials. The etch stop layer 482 may be formed using a deposition method such as CVD. The ILD 484 may be formed using spin coating, flowable chemical vapor deposition (FCVD), or the like, or formed using a deposition method such as plasma enhanced chemical vapor deposition (PECVD), low pressure chemical vapor deposition (LPCVD), or the like.

Figure 14:
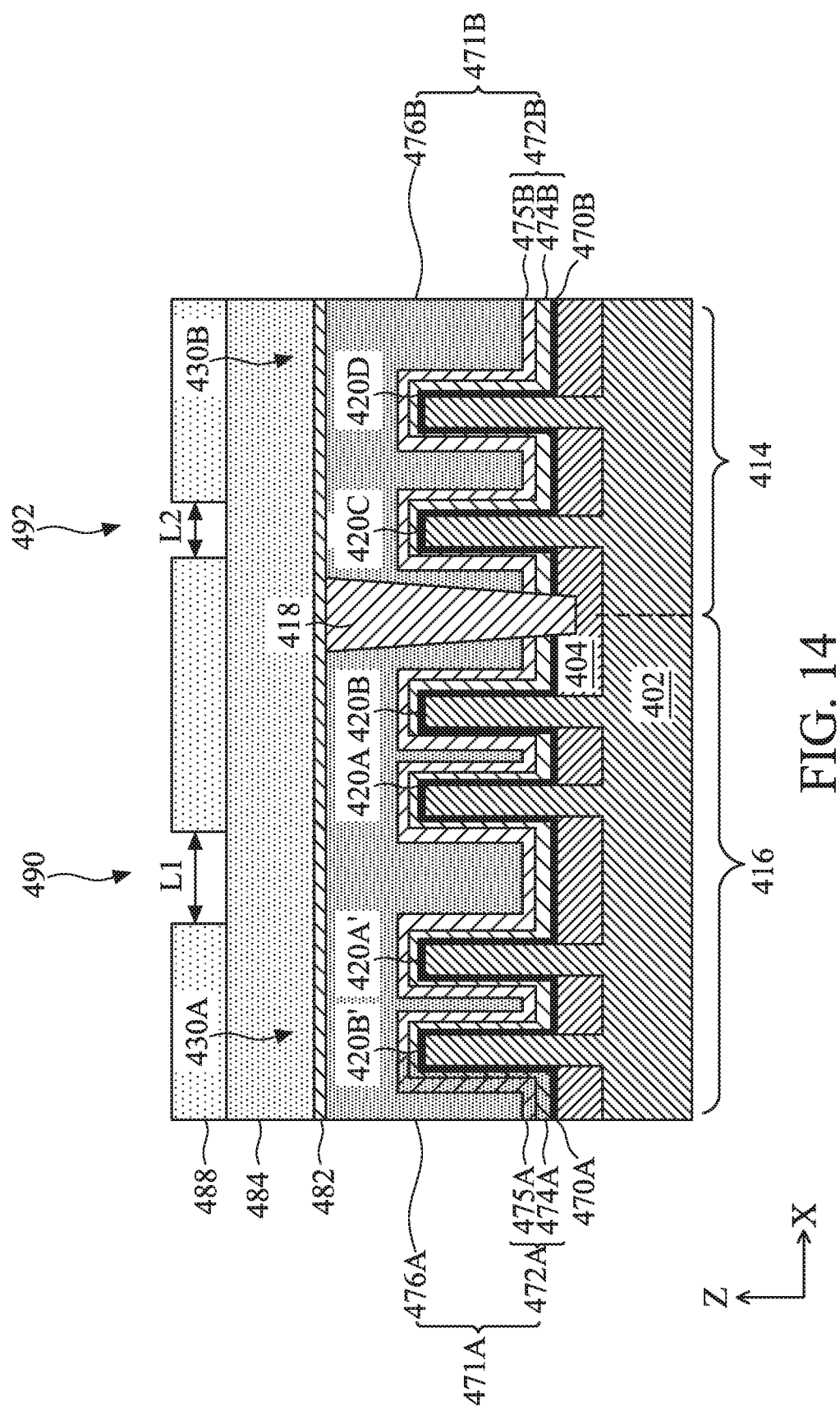

Referring to FIGS. 7 and 14, at operation 710, the method 700 forms one or more hard mask layers over the device 600. A hard mask layer 488 is illustrated in this example. In an embodiment, the hard mask layer 488 includes silicon nitride. The hard mask layer 488 may be deposited using CVD, PVD, ALD, or other suitable methods. Operation 710 also patterns the hard mask layer 488 to form a pattern hard mask. Referring to FIG. 14, the hard mask layer 488 is patterned (e.g., etched) to provide an opening 490 in the NFET region 416 and an opening 492 in the PFET region 414. In an example, the operation 710 may form a patterned photoresist over the hard mask layer 488 by photoresist coating, exposing, post-exposure baking, and developing. Then, the operation 710 etches the hard mask layer 488 using the patterned photoresist as an etch mask to form the openings 490 and 492. The etching process may include wet etching, dry etching, reactive ion etching, or other suitable etching methods. The patterned photoresist is removed thereafter, for example, by resist stripping. It is noted that the sidewalls of the openings 490 and 492 at the hard mask layer 488 are vertical or nearly vertical.

In some embodiments, the opening 490 is laterally between the fins 420A and 420A' and the opening 492 is directly above the fin 420C. The opening 490 and the opening 492 have the widths measured in gate pitch direction (Y-direction), which are substantially the same as the width of the gate structures 430A and 430C. The opening 490 and the opening 492 have the lengths (L1 and L2, respectively) measured in gate pitch direction (Y-direction). The length L2 of the opening 492 is substantially the same as its width. The length L1 of the opening 490 is about 2 times to about 3 times of its width (that is also about 2 times to about 3 times of L2).

Figure 15:
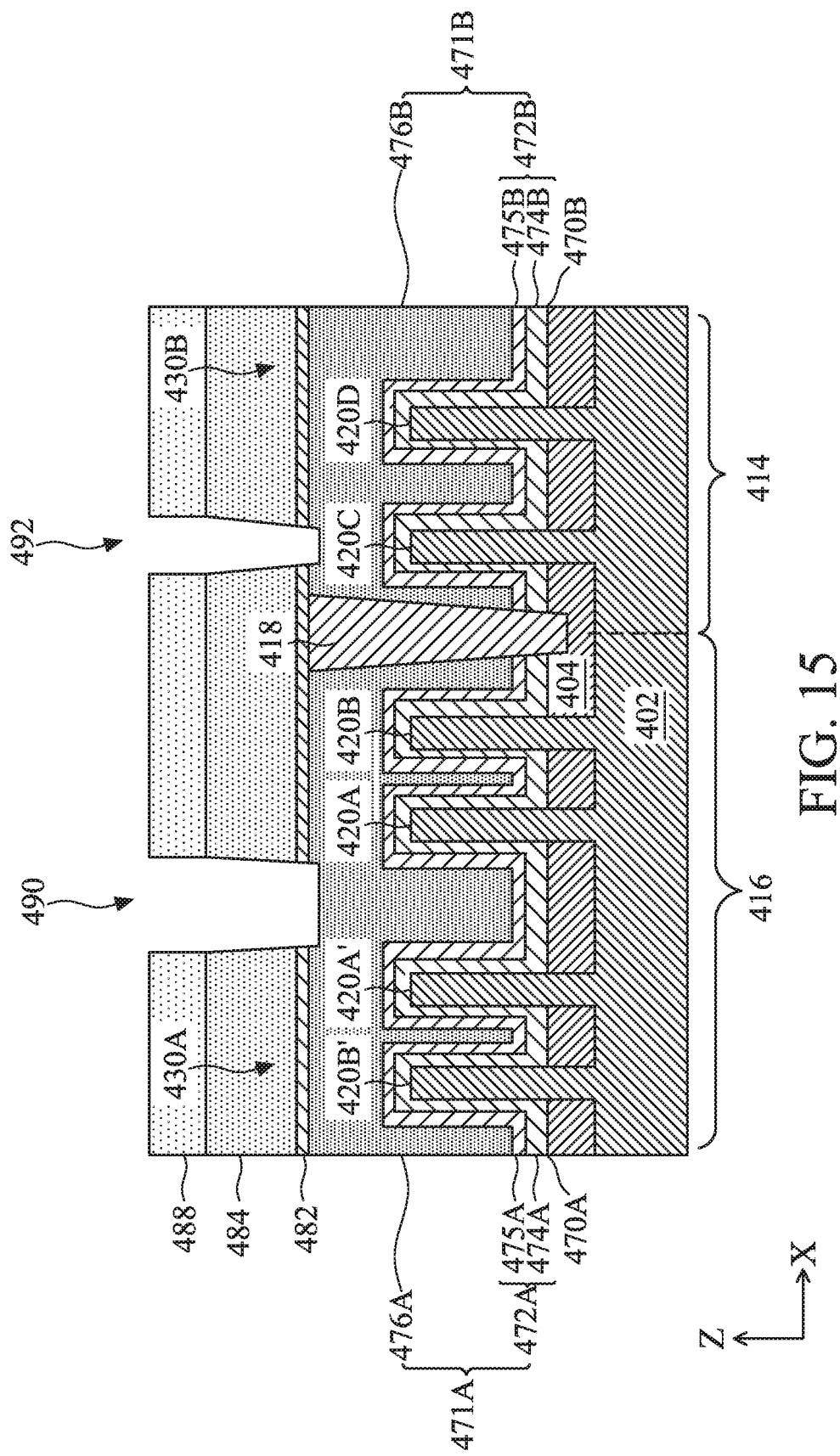

Referring to FIGS. 7 and 15, at operation 712, the method 700 performs an etching process to extend openings 490 and 492 downwardly through the ILD 484 and the etch stop layer 482, thereby forming gate contact openings. The etching process may include wet etching, dry etching, reactive ion etching, or other suitable etching methods. In some embodiments, the etch at operation 712 includes two steps. One of the two steps is a main etching step that etches through the ILD 484 and the etch stop layer 482, which exposes the conductive layers 476A and 476B. After the main etching step is an over etching step. The over etching step extends the gate contact openings 490 and 492 further into a top portion of the conductive layers 476A and 476B for larger contact areas.

Figure 16:
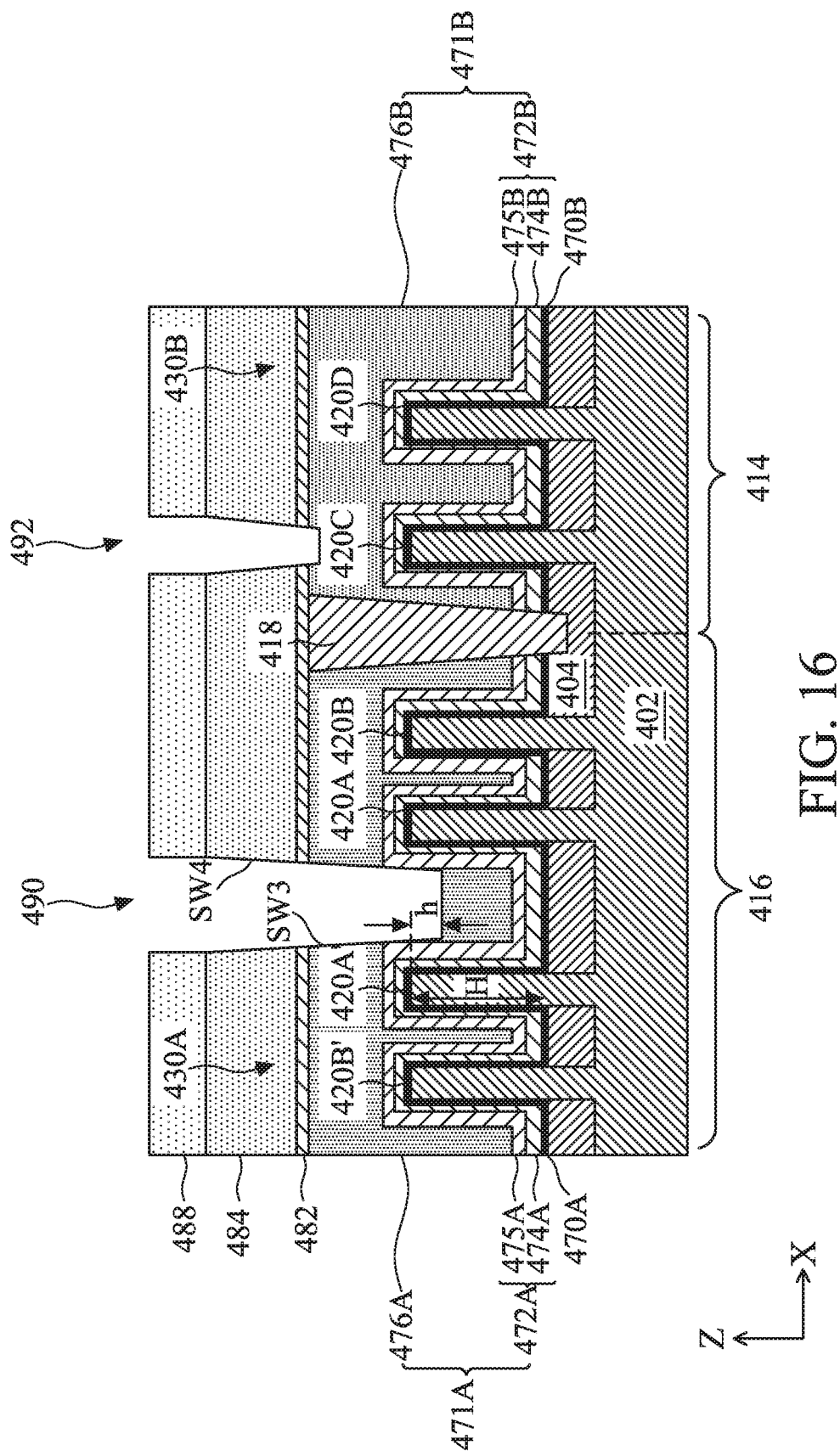

Referring to FIGS. 7 and 16, at operation 714, the method 700 etches the gate electrode 472A of the high-k metal gate 430A through the opening 490 in the NFET region 416. The PFET region 414 may be covered by a photoresist resist layer (not shown) to limit the etching through the opening 490 only but not opening 492. Operation 714 extends the opening 490 further into the gate electrode 472A. In the illustrated embodiment, the opening 490 extends below a top surface of the fins 420. In furtherance of the embodiment, the opening 490 extends below a top surface of the fins 420 for a distance h that is less than half of the fin height H (measured from a top surface of the isolation structure 404). If the distance h is not less than half of the fin height H, the conductive layer 476A directly under the opening 490 may become too thin and would negatively impact normal transistor operation.

The etching process may use one or more etchants or a mixture of etchants that etch the various layers in the gate electrode 471A. The operation 714 may apply a dry etching process with the use of a process gas mixture of sulfur fluoride ($SF_6$) and oxygen ($O_2$) as the dry etchant. In some other embodiments, the etching process of the operation 714 is a wet etching process with the use of aqueous potassium chloride (KOH) solution as the wet etchant. In these embodiments, as both the $SF_6/O_2$ gas mixture and the potassium chloride solution contain some forms of oxygen, they can be collectively referred to as oxygen-containing etchants or oxygen-atom-containing etchants. Still further, operation 714 may also control the etching bias voltage in a dry etching or alternative to controlling the etchants in a wet etching. For example, a higher etching bias voltage (along the Z direction) tends to produce more vertical sidewalls in the opening 490, while a lower etching bias voltage reduces the downward ion bombardment by the etchants, resulting in slanted sidewalls. In the illustrated embodiment, the sidewalls SW3/SW4 are slanted in a way such that a portion of the second work function layer 475A is also etched and exposed on the sidewalls SW3/SW4. In some embodiments, operation 714 may apply the etching bias voltage in the range of 50 to 100 V. Furthermore, the operation 714 may perform the etching process at a pressure of 5 to 20 mTorr, energy of 100 to 200 W, and a temperature of 75 to 125 degrees Celsius in the present embodiment. Various other values of etching bias voltage, etching pressure, etching energy, and etching temperature are possible.

In some implementations represented in FIG. 16, an oxygen-containing etchant used at operation 714 reacts with aluminum atoms in the second work function layer 475A (e.g., a TiAl layer) and form aluminum-oxide-containing compound (e.g., TiAlOx), which is rich in an outer portion approximate to the sidewalls SW3/SW4 of the opening 490, while inner portion of the second work function layer 475A is substantially free of aluminum-oxide-containing compound. The outer portion, once converted into an aluminum-oxide-containing compound by the chemical reaction with an oxygen-containing etchant, serves as an etch passivation layer that retards the etching of second work function layer 475A by the oxygen-containing etchant.

By having the opening 490 larger and deeper into the gate electrode 471A than usual (e.g., compared to the opening 492), aluminum-containing compound in the second work function layer 475A is converted to aluminum-oxide-containing compound in a larger and deeper opening. Such conversion increases Vt of an n-type transistor and thus allows the first work function layer 474A to be thinner during its deposition to offset the Vt increasement. A thinner work function layer 474A is easier to be deposited into a high-aspect-ratio gate trench in a "gate-last" process with a higher uniformity and also spares more room for the later depositing of the other conductive layers thereabove.

Figure 17:
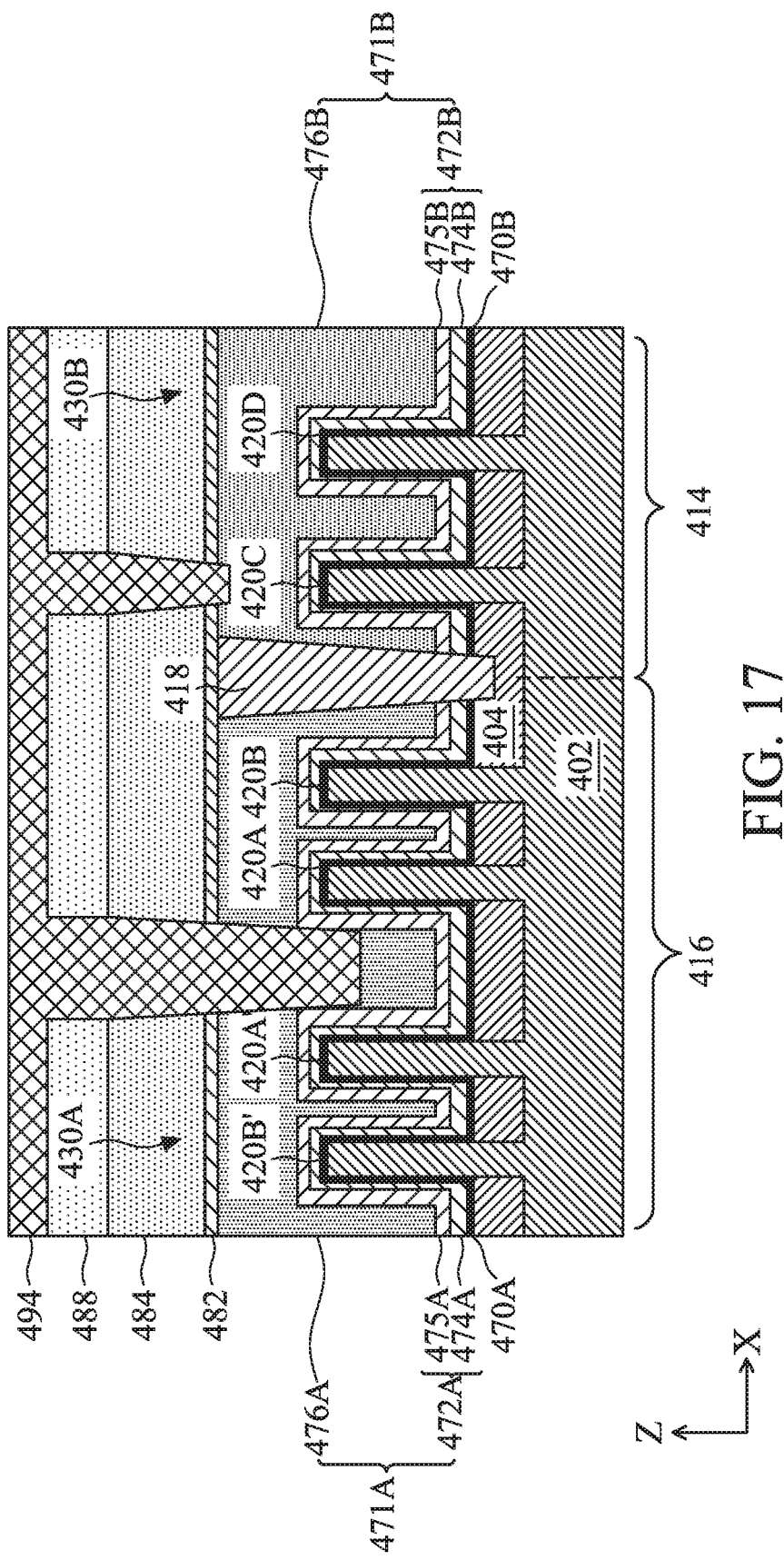

Referring to FIGS. 7 and 17, at operation 716, the method 700 fills the openings 490 and 492 with one or more conductive materials to form a conductive layer 494. The conductive layer 494 may comprise tungsten, copper, aluminum, other suitable conductive material, or combinations thereof. The conductive layer 494 may be formed by suitable deposition processes, such as CVD or PVD. In yet one embodiment, the formation of the conductive layer 494 may include a single damascene process or a dual damascene process. In one embodiment, the conductive layer 494 further include a liner layer (not shown). The liner layer may include TaN, TiN, HfN, ZrN, WN, NbN, MoN, combinations thereof, and/or other suitable conductive material. The liner layer may be formed by ALD, CVD, PVD, plating, and/or other suitable deposition processes.

Figure 18:
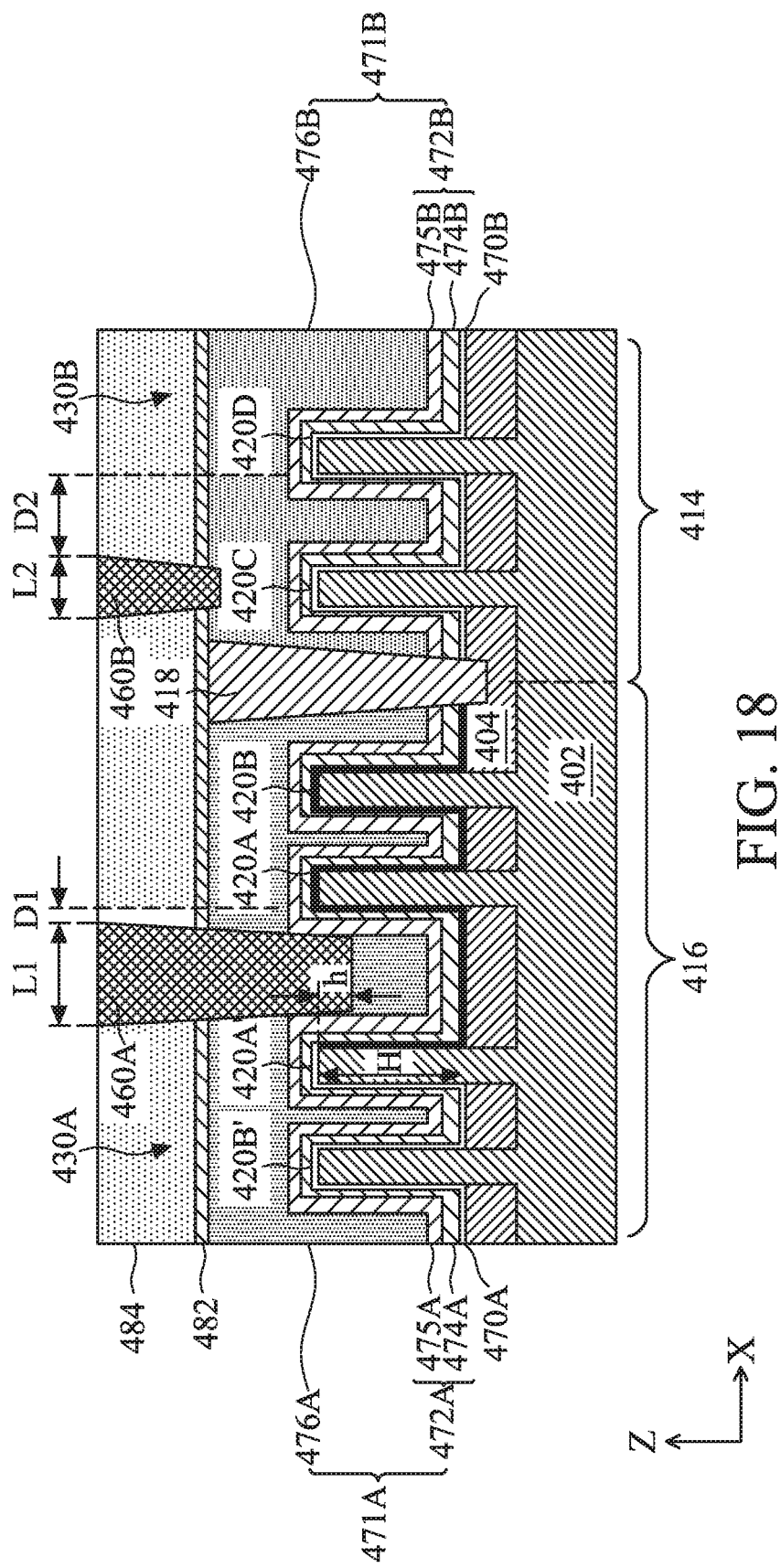

Referring to FIGS. 7 and 18, at operation 718, the method 700 performs one or more CMP processes to remove excessive conductive layer 494 (the portion outside the openings 490 and 492) and the hard mask 488. After operation 718, the recessed conductive layer 494 becomes two portions—the gate contact 460A filling the opening 490 over NFET region 416 and the gate contact 460B filling the opening 492 over PFET region 414. Similar to what has been discussed above regarding openings 492 and 490, the gate contacts 460A and 460B have the widths measured in gate pitch direction (Y-direction), which are substantially the same as the width of the gate structures 430A and 430C. The gate contacts 460A and 460B have the lengths (L1 and L2, respectively) measured in gate pitch direction (Y-direction). The length L2 of the gate contact 460B is substantially the same as its width. The length L1 of the gate contact 460A is about 2 times to about 3 times of its width (that is also about 2 times to about 3 times of L2). This range provides a good compromise of effective threshold voltage tuning and acceptable distance to adjacent fins, such that when L1 is larger than 3 times of its width (and L2) the gate contact 460A becomes too close to fins 420A and 420A' and hence may interfere normal transistor operation, and when L1 is smaller than 2 times of its width (and L2) the threshold voltage tuning may not be effective and hence the thickness reduction of the first work function layer 474A may not be meaningful. Due to the relatively larger L1, a ratio of the distance D1 between the gate contact 460A and the fin 420A to the width of the gate contact 460 may thus be less than 1:1, such as about 0.4:1 to about 0.8:1 in a specific example. As a comparison, a ratio of the distance D2 between the gate contact 460B and the fin 420D to the width of the gate contact 460B is larger than 1:1, such as about 1.1:1 to about 2:1 in a specific example. A bottom surface of the gate contact 460A is below a top surface of the fins 420 for a distance h that is less than half of the fin height H, such as about 0.2 times to about 0.4 times of the fin height H in a specific example. As discussed above, if the distance h is not less than half of the fin height H, the conductive layer 476A directly under the opening 490 may become too thin and would negatively impact normal transistor operation. In some embodiments, the gate contact 460A is in physical contact with the metal fill layer 476A and the second work function layer 475A, while the gate contact 460B is in physical contact with the metal fill layer 476B.

Referring to FIG. 7, at operation 720, the method 700 performs further steps to complete the fabrication of the device 600. For example, the method 700 may form via layers and metal layers above the gate contacts to form metal interconnections in connecting various transistors to form a complete IC.

Although not intended to be limiting, one or more embodiments of the present disclosure provide many benefits to a semiconductor device and the formation thereof. For example, embodiments of the present disclosure provide larger and deeper gate contacts for n-type transistors formed in p-wells. The larger and deeper gate contacts allow one or metal layers in a metal gate structure to be thinner and easier to be deposited in a high-aspect-ratio gate trench. Further, embodiments of the present disclosure can be readily integrated into existing semiconductor manufacturing processes.

In one exemplary aspect, the present disclosure is directed to a method for manufacturing a semiconductor device.

In another exemplary aspect, the present disclosure is directed to a method for manufacturing a semiconductor device.

In yet another exemplary aspect, the present disclosure is directed to a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a structure that includes a substrate with a first region and a second region, an isolation structure over the substrate, a first fin extending from the first region of the substrate and through the isolation structure, a second fin extending from the second region of the substrate and through the isolation structure, a first gate structure engaging the first fin, and a second gate structure engaging the second fin;
   depositing a dielectric layer over the first and second gate structures;
   etching the dielectric layer, thereby forming a first gate contact opening exposing the first gate structure and a second gate contact opening exposing the second gate structure, wherein the first gate contact opening has a first length that is larger than a second length of the second gate contact opening; and
   filling the first and second gate contact openings with conductive material, thereby forming a first gate contact engaging the first gate structure and a second gate contact engaging the second gate structure.

2. The method of claim 1, further comprising:
   etching the first gate structure through the first gate contact opening, such that the first gate contact opening is deeper than the second gate contact opening.

3. The method of claim 1, wherein the first gate contact opening has a bottom surface below a top surface of the first fin and the second gate contact opening has a bottom surface above a top surface of the second fin.

4. The method of claim 3, wherein the bottom surface of the first gate contact is below the top surface of the first fin for a distance smaller than half of a height of the first fin.

5. The method of claim 1, wherein the first gate contact opening has a first width that substantially equals a second width of the second gate contact opening.

6. The method of claim 1, wherein the first length of the first gate contact opening is about 2 times to about 3 times of the second length of the second gate contact opening.

7. The method of claim 1, wherein the first gate contact opening exposes a work function layer of the first gate structure.

8. The method of claim 7, wherein the work function layer of the first gate structure includes TiAl.

9. The method of claim 1, wherein the first region and the second region are of opposite types.

10. The method of claim 9, wherein the first region provides a p-well for forming n-type transistors and the second region provides an n-well for forming p-type transistors.

11. The method of claim 1, further comprising:
    forming an isolation feature between the first and second fins, wherein the isolation feature is higher than the first and second fins and partially embedded in the isolation structure.

12. A method of forming a semiconductor device, comprising:
    providing a structure that includes a substrate, a fin protruding from the substrate, an isolation structure surrounding the fin, and a gate structure engaging the fin;
    forming a dielectric layer over the gate structure;
    etching the dielectric layer to form an opening exposing the gate structure, wherein the opening has a rectangular shape in a top view;

etching the gate structure through the opening, thereby extending the opening below a top surface of the fin; and filling the opening with conductive material, thereby forming a gate contact landing on the gate structure.

13. The method of claim 12, wherein the rectangular shape has a width substantially equal to a width of the gate structure.

14. The method of claim 12, wherein the rectangular shape has a length that is about 2 times to about 3 times of a width.

15. The method of claim 12, wherein the gate structure includes aluminum-containing compound, and the etching of the gate structure includes applying an oxygen-containing etchant that creates aluminum-oxide-containing compound.

16. The method of claim 12, wherein the gate structure and the fin form an n-type transistor of a memory cell, and the gate contact electrically couples the gate structure to a word line of the memory cell.

17. A semiconductor device, comprising:
a substrate having a first region of a first type and a second region of a second type that is opposite to the first type;
a first fin protruding from the substrate in the first region;
a first gate structure in the first region engaging the first fin;
a first gate contact in the first region and landing on the first gate structure;
a second fin protruding from the substrate in the second region;
a second gate structure in the second region engaging the second fin; and
a second gate contact in the second region and landing on the second gate structure, wherein the first gate contact has a bottom surface lower than the second gate contact.

18. The semiconductor device of claim 17, wherein the bottom surface of the first gate contact is below a top surface of the first fin.

19. The semiconductor device of claim 17, wherein a top surface of the first gate contact has a rectangular shape and a top surface of the second gate contact has a square shape, and wherein the rectangular shape has a larger area than the square shape.

20. The semiconductor device of claim 17, wherein the first gate contact is laterally offset from the first fin and the second gate contact is directly above the second fin.

* * * * *